US006929873B2

(12) United States Patent
Tsuboyama et al.

(10) Patent No.: US 6,929,873 B2
(45) Date of Patent: Aug. 16, 2005

(54) ELECTROLUMINESCENT DEVICE USING METAL COORDINATION COMPOUND

(75) Inventors: Akira Tsuboyama, Kanagawa (JP); Shinjiro Okada, Kanagawa (JP); Takao Takiguchi, Tokyo (JP); Koichi Suzuki, Kanagawa (JP); Seishi Miura, Kanagawa (JP); Takashi Moriyama, Kanagawa (JP); Satoshi Igawa, Kanagawa (JP); Jun Kamatani, Kanagawa (JP); Manabu Furugori, Kanagawa (JP); Hironobu Iwawaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/400,642

(22) Filed: Mar. 28, 2003

(65) Prior Publication Data

US 2004/0013905 A1 Jan. 22, 2004

Related U.S. Application Data

(63) Continuation of application No. PCT/JP03/02540, filed on Mar. 5, 2003.

(30) Foreign Application Priority Data

Mar. 8, 2002 (JP) ...................................... 2002-063668

(51) Int. Cl.$^7$ ......................... H05B 33/14; C09K 11/06; C07D 213/02; C07D 471/14
(52) U.S. Cl. ...................... 428/690; 428/917; 313/504; 313/506; 257/40; 257/102; 546/2; 546/4; 546/10
(58) Field of Search ................................ 428/690, 917; 313/504, 506; 257/40, 102; 546/2, 4, 10

(56) References Cited

U.S. PATENT DOCUMENTS

| 2001/0019782 A1 | | 9/2001 | Igarashi | 428/690 |
|---|---|---|---|---|
| 2002/0134984 A1 | * | 9/2002 | Igarashi | 257/79 |
| 2003/0040627 A1 | * | 2/2003 | Fujii | 546/2 |
| 2003/0080342 A1 | * | 5/2003 | Igarashi | 257/79 |

FOREIGN PATENT DOCUMENTS

| JP | 2001-226146 | 8/2001 |
|---|---|---|
| JP | 2001-247859 | 9/2001 |
| JP | 2002-63668 | 2/2002 |
| JP | 2002-173674 | 6/2002 |
| JP | 2002-203680 | 7/2002 |
| JP | 2002-203681 | 7/2002 |
| JP | 2003-504506 | 2/2003 |
| WO | 01/06227 | 1/2001 |

OTHER PUBLICATIONS

Li et al., "Carbonyl polypyridyl Re(l) complexes as organic electroluminescent materials", Synthetic Metals, vol. 99, pp. 257–260, Feb. 26, 1999.*

J. Spengler, et al. "5,6–Alkylsubstituierte 4–Pyrimidinone mit H$_2$–antihistaminischer Wirkung", Arch. Pharm., vol. 317, pp. 425–430 (1984), (no month).

M. Iyoda, et al., "Homocoupling of Aryl Halides Using Nickel (II) Complex and Zinc in the Presence of Et$_4$NI", Bull, Chem. Soc. Jpn., vol. 63, pp. 80–87 (Jan. 1990).

S. Lamansky, et al., "Synthesis and Characterization of Phosphorescent Cyclometalated Iridium Complexes", Inorg. Chem., vol. 40, pp. 1704–1711 (2001), published on web Mar. 1, 2001.

C.H. Chen, et al., "Recent Developments in Molecular Organic Electroluminescent Materials", Macromol. Symp., vol. 125, pp. 1–48 (1997), (no month).

V.H. Zaschke, "5–n–Alkyl–2–(4–n–alkoxy–phenyl)–pyrimidine", J. Prakt. Chem., vol. 317, No. 4, pp. 617–630 (1975), (no month).

T.U. Gerngross, et al., "Enzyme–Catalyzed Synthesis of Poly[(R)–(–)–3–hydroxybutyrate]: Formation of Macroscopic Granules In Vitro", Proc. Nat'l Acad. Sci., vol. 92, pp. 6279–6283 (Jul. 1995).

M.A. Baldo, et al., "Very High Efficiency Green Organic Light–Emitting Devices Based on Electrophosphorescence", Appl. Phys. Lett., vol. 75, No. 1, pp. 4–6 (Jul. 1999).

D.F. O'Brien, et al., "Improved Energy Transfer in Electrophosphorescent Devices", Appl. Phys. Lett., vol. 74, No. 3, pp. 442–444 (Jan. 1999).

S.M. Fredericks, et al., "Multiple Emissions from Rhenium (I) Complexes: Intraligand and Charge–Transfer Emission from Substituted Metal Carbonyl Cations", J. Am. Chem. Soc., vol. 101, No. 24, pp. 7415–7417 (Nov. 1979).

L. Wallace, et al., "Photophysical Properties of Rhenium (l) Tricarbonyl Complexes Containing Alkyl–and Aryl–Substituted Phenanthrolines as Ligands", Inorg. Chem., vol. 32, pp. 3836–3843 (1993), (no month).

D. Tzalis, et al., "Simple One–Step Synthesis of 3–Bromo–and 3,8–Dibromo–1,10–Phenanthroline: Fundamental Building Blocks in the Design of Metal Chelates", Tetrahedron Lett., vol. 36, No. 20, pp. 3489–3490 (1995), (no month).

C. Boldron, et al., "Simple and Efficient Synthesis of 1,10–Phenanthrolines Substituted at C3 or C3 and C8 by Methoxy or Hydroxy Groups", Synlett, No. 10, pp. 1629–1631 (2001), (no month).

(Continued)

Primary Examiner—Marie Yamnitzky
(74) Attorney, Agent, or Firm—Fitzpatrick, Cella, Harper & Scinto

(57) ABSTRACT

A luminescent device having a high luminescence efficiency and a high luminance is provided by using a rhenium coordination compounds the luminescent device comprising a Re complex compound provided between a pair of electrodes on a substrate, wherein the Re complex compound is expressed by the following general formula:

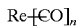

wherein Re is rhenium, CO is a carbonyl group, and n is an integer ranging from 1 to 5.

6 Claims, 18 Drawing Sheets

OTHER PUBLICATIONS

T. Yamamoto, et al., "Preparation of Soluble π–Conjugated Poly(5,6–dialkoxy–1,10–phenanthroline–3,8–diy)s", Chem. Lett., pp. 774–775 (2002), (no month).

F.H. Case, "Substituted 1,10–Phenanthrolines", J. Org. Chem., vol. 16, pp. 941–945 (1951), (no month).

L. Zhu, et al., "The Direct Formation of Functionalized Alkyl(aryl)zinc Halides by Oxidative Addition of Highly Reactive Zinc with Organic Halides and Their Reactions with Acid Chlorides, α,β–Unsaturated Ketones, and Allylic, Aryl and Vinyl Halides", J. Org. Chem., vol. 56, pp. 1445–1453 (1991), (no month).

A.S. Bell, et al., "A Synthesis of 2–and 4(5)–(2–Pyridinyl)Imidazoles by Palladium–Catalysed Cross–Coupling Reactions", Tetrahedron Lett., vol. 29, No. 39, pp. 5013–5016 (1988), (no month).

M. Schmittel, et al., "A Short Synthetic Route to Novel, Highly Soluble 3,8–Dialkyl–4,7–dibromo–1,10–phenanthrolines", Synlett, No. 9, pp. 1096–1098 (Sep. 1977).

J.V. Caspar, et al., "Application of the Energy Gap Law to Nonradiative, Excited–State Decay", J. Phys. Chem., vol. 87, pp. 952–957 (1983), (no month).

* cited by examiner

Bphen

FIG. 3
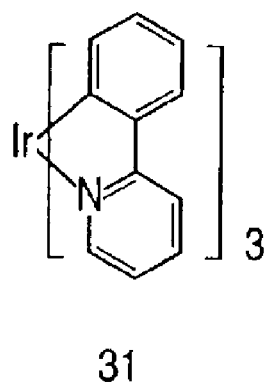
31
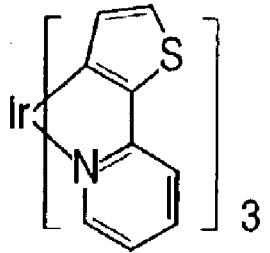
32
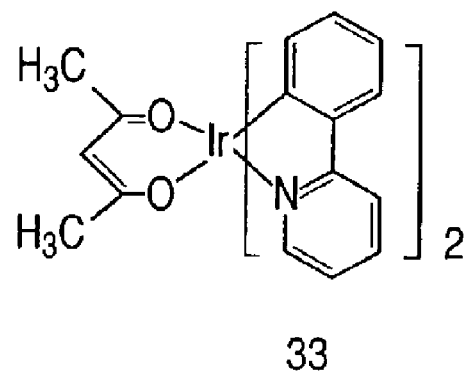
33
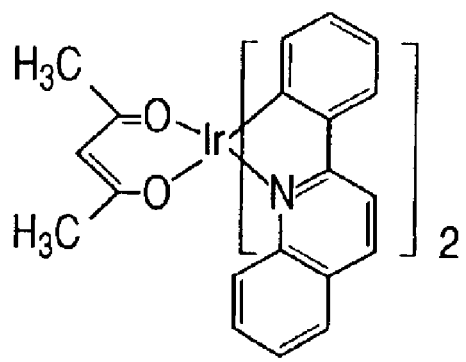
34
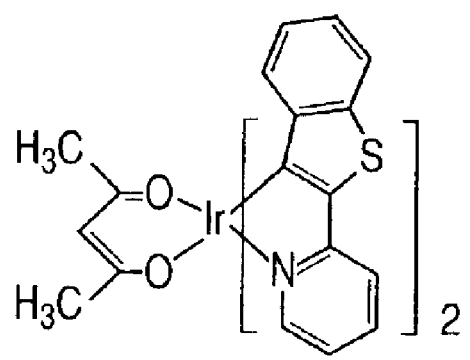
35

FIG. 6
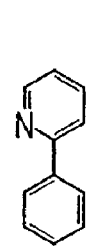  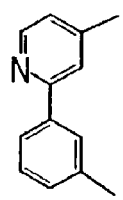  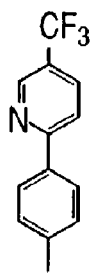  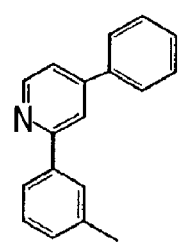  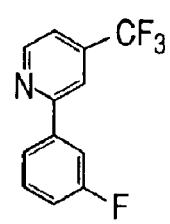
61     62     63     64     65
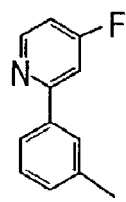  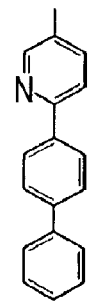  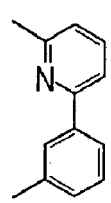  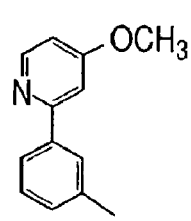  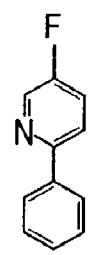  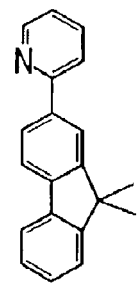
66     67     68     69     610     611
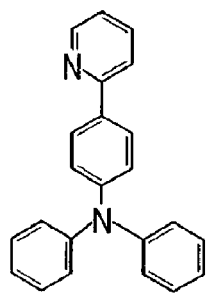
612

FIG. 7
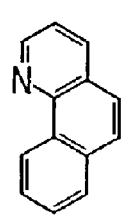 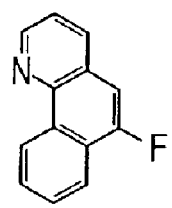 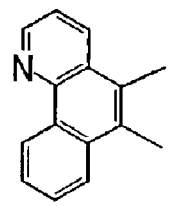 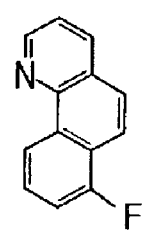
71   72   73   74
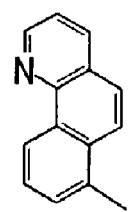 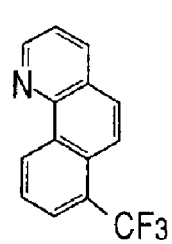 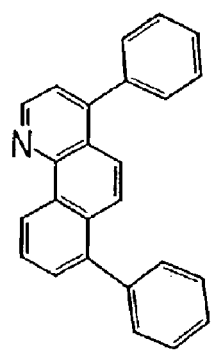 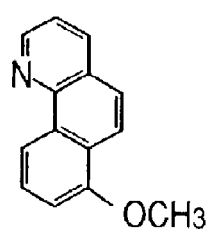
75   76   77   78

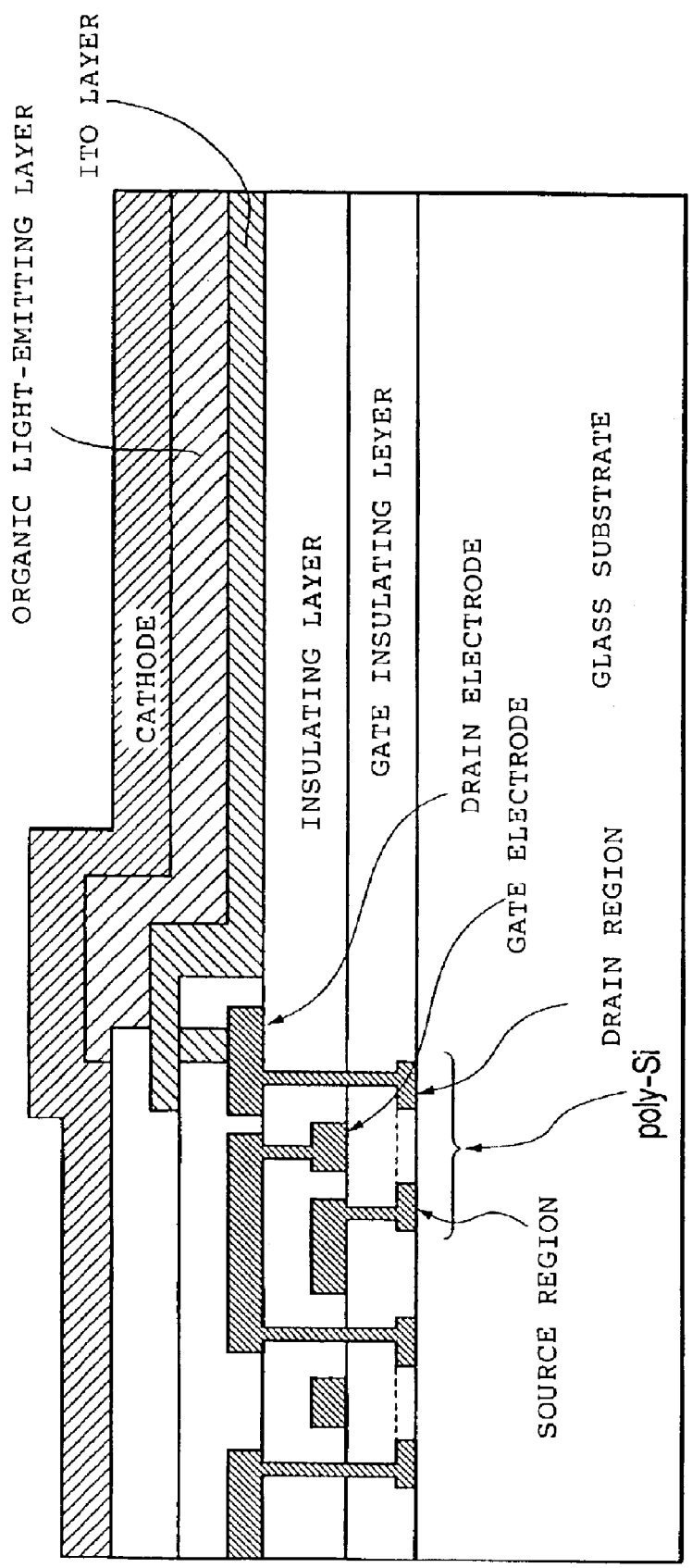

FIG. 21
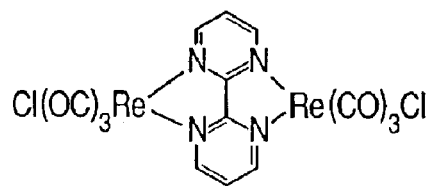
EXEMPLARY COMPOUND 350
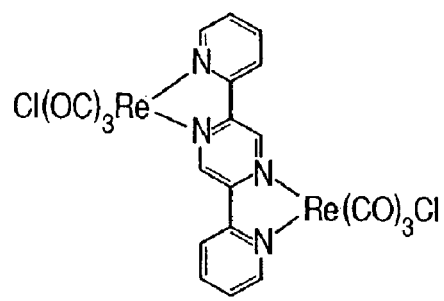
EXEMPLARY COMPOUND 351

ELECTROLUMINESCENT DEVICE USING METAL COORDINATION COMPOUND

This application is a continuation of International Application No. PCT/JP03/02540, filed Mar. 5, 2003.

BACKGROUND OF THE INVENTION

1. Field of the Invention

The present invention relates to an electroluminescent device using an organic compound and, more particularly, to an electroluminescent device having high luminescence efficiency and a long luminescence life achieved by using a metal coordination compound as a luminescent material.

2. Related Background Art

A lot of studies is conducted on organic electroluminescent (EL) devices for practical use, which are electroluminescent devices having high-speed response and high efficiency. FIGS. 1A and 1B show basic constructions of such electroluminescent devices (for example, see Macromol. Symp. 125, 1–48 (1997)).

As shown in FIGS. 1A and 1B, a typical organic EL device is ordinarily constituted by a transparent electrode 14 on a transparent substrate 15, a metal electrode 11, and a plurality of organic film layers provided between the transparent electrode 14 and the metal electrode 11.

Referring to FIG. 1A, the organic layers are a light-emitting layer 12 and a hole transport layer 13. ITO or the like having a large work function is used as the transparent electrode 14. Thus, there are provided good characteristics of hole injection from the transparent electrode 14 into the hole transport layer 13. A metal material such as aluminum, magnesium or an alloy of aluminum and magnesium having a small work function is used as the metal electrode 11 to obtain good characteristics with respect to injection of electrons to the organic layers. These electrodes typically have a film thickness of 50 to 200 nm.

For the light-emitting layer 12, an aluminum quinolinol complex having electron-transport and luminescence characteristics, typically Alq3 shown in FIG. 2A or the like is used. For the hole transport layer 13, an electron donative material such as triphenyl diamine derivative, typically α-NPD shown in FIG. 2A or the like is used.

The device constructed as described above exhibits a rectification characteristic. When an electric field is applied such that the metal electrode 11 functions as a cathode and the transparent electrode 14 functions as an anode, electrons are injected from the metal electrode 11 into the light-emitting layer 12 while holes are injected from the transparent electrode 14.

The injected holes and electrons recombine with each other in the light-emitting layer 12 to cause excitons, thereby emitting light. At this time, the hole transport layer 13 functions as an electron blocking layer. Therefore the efficiency of recombination at the interface of the light-emitting layer 12 and the hole transport layer 13 is increased. The luminescence efficiency is thereby increased.

Referring to FIG. 1B, an electron transport layer 16 is further provided between the metal electrode 11 and the light-emitting layer 12 shown in FIG. 1A. When an electron transport layer is additionally provided independently in this manner to obtain a more effective carrier blocking structure, more efficient luminescence can be effected in the luminance layer. As a material for the electron transport layer 16, an oxadiazole derivative, or Alq3 or Bphen shown in FIGS. 2A and 2B, for example, may be used.

When a typical organic EL device emits light, fluorescence takes place which is caused by transition from singlet excitons to the ground state in molecules having emission centers. On the other hand, studies are being made on devices not using fluorescence via singlet excitons but using phosphorescence via triplet excitons.

The followings are typical references made public about the results of such studies.

Reference 1: D. F. O'Brien et al., "Improved energy transfer in Electrophosphorescent device", Applied Physics Letters Vol. 74, No. 3, p. 422 (1999)

Reference 2: M. A. Baldo et al., "Very high-efficiency green organic light-emitting devices based on Electrophosphorescence", Applied Physics Letters Vol. 75, No. 1, p. 4 (1999)

Devices mainly used in these references are constructed by four organic layers as shown in FIG. 1C. This device is formed by stacking, from the anode side, a hole transport layer 13, a light-emitting layer 12, an exciton diffusion prevention layer 17, and an electron transport layer 16. Materials used in the device are carrier transport materials and phosphorescent materials shown in FIGS. 2A and 2B. The followings are the meanings of acronyms shown in FIGS. 2A and 2B.

Alq3: aluminum-quinolinol complex
α-NPD: N4,N4'-Di-naphthalen-1-yl-N4,N4'-diphenyl-biphenyl-4,4'-diamine
CBP: 4,4'-N,N'-dicarbazole-biphenyl
BCP: 2,9-dimethyl-4,7-diphenyl-1,10-phenanthroline
Bphen: 4,7-diphenyl-1,10-phenanthroline
PtOEP: platinum-octaethylporphylin complex
Ir(ppy)3: iridium-phenylpyridine complex Devices capable of obtaining high efficiency according to the above-mentioned two references are those formed by using α-NPD in the hole transport layer, Alq3 in the electron transport layer, and BCP in the exciton diffusion prevention layer, and using CBP as a host material in the light-emitting layer and mixing therein a phosphorescent material such as Ir(ppy)3 or PtOEP at a concentration of about 6% in the material of the light-emitting layer.

In recent years, phosphorescent materials have attracted particular attention because a high luminescence efficiency can be expected in theory. That is, excitons generated by carrier recombination consist of singlet excitons and triplet excitons and the ratio in probability of their occurrence is 1:3. The conventional organic EL devices emit light by utilizing fluorescence caused by transition from singlet excitons to the ground state. The luminescence efficiency of such fluorescence in theory is 25% with respect to the number of generated excitons, and this value is a theoretical upper limit. However, if phosphorescence from excitons generated from triplets is used, at least a treble yield can be expected in theory. Further, if transition by intersystem crossing from higher singlets in energy to triplets is included, a quadruple luminescence yield, i.e., 100% luminescence yield, can be expected in theory.

While the organic EL devices using phosphorescence have a problem of luminescence efficiency, they also have the problem of deterioration of luminescence at the time of energization. The cause of luminescence deterioration of electrophosphorescent devices is presently uncertain, but it is thought that it is caused by reaction with neighboring materials, formation of an excited multimer, change in molecular microstructure, influence of impurities, structural change of neighboring materials, etc., which occur because the triplet life is ordinarily longer than the singlet life by three or more orders of magnitude, and the molecules are maintained in a high-energy state.

Phosphorescent devices are studied by many groups of researchers. Metal coordination compounds that are employed in the studies have iridium as the central metal.

The following Reference 3 reports as this example.

Reference 3: S. Lamansky et al., "Synthesis and Characterization of Phosphorescent Cyclometalated Iridium complex", Inorg. Chem. 40, p. 1704, (2001)

In general, a material capable of effecting phosphorescence with high efficiency is a compound that has a central metal of a relatively large atomic weight. Phosphorescence is caused by transition from excited triplets to ground singlets. Such transition is a forbidden transition in the case of ordinary organic materials. In some metal coordination compound using a heavy-atom metal, however, this forbiddance is eliminated by "heavy-atom effect" so that the transition is allowed to occur resulting in strong phosphorescence occurrence.

An example of such a metal coordination compound is a metal coordination compound using iridium metal. However, a metal coordination compound using a heavy-atom metal such as an iridium coordination compound, of course has a large molecular weight. Therefore, there is a problem that thermal decomposition of the iridium coordination compound occurs during film deposition in fabrication of an organic EL device. If decomposition occurs, a decomposition product is mixed in the formed light-emitting layer, thereby causing reduction of luminescence life of the luminescent device and considerable variation in the devices at the time of mass production.

Typical iridium metal coordination compounds are, for example, compounds having molecular structures represented by Nos. 31 to 35 in FIG. 3. In compound 31, three phenylpyridine ligands are coordinated. In compound 33, two phenylpyridine ligands are coordinated. Compounds 31 and 33 have molecular weights of 655 and 600, respectively. On the other hand, Alq3 shown in FIG. 2A has a molecular weight of 459 smaller than those of the above-described iridium coordination compounds.

These compounds were vacuum-deposited at the same deposition rate and residues in the deposition boat were analyzed. The results of the analysis showed that decomposition does not occur in the case of Alq3. The results also shows that, in the case of iridium coordination compound deposition for a long time, decomposition compounds of 0.1 to 3% were produced. It is thereby understood that there is a possibility of the iridium coordination compound decomposing in the deposition boat under severe conditions, such as those under which a number of devices are made in mass production, to cause an increase of impurity concentration in the device, which may adversely affect the device performance and the production stability.

Further, it is likely that a coordination compound having a ligand with a longer conjugate length is produced to allow light emission with longer wavelength. Compounds 34 and 35 are shown in FIG. 3 as an example of a compound modified in this manner. In this case, the longer ligand results in a larger molecular weight, and a higher sublimation temperature, which makes the deposition more difficult and adversely affects the productivity.

As a coordination compound with a reduced molecular weight, hetero-ligand compounds 33 to 35 have been proposed based on ternary coordination compounds such as compounds 31 and 32 shown in FIG. 3. However, the illustrated acetylacetonate is lower in thermostability than ternary coordination compounds, and a problem of decomposition of the compound occurs.

Phosphorescent materials also have a problem of deterioration by a chemical reaction in the device at the time of energization in addition to the above-mentioned impurity problem.

There is also a case where a rhenium complex is used in a light-emitting layer of an electroluminescent device, which is disclosed in the following reference, in which several rhenium complexes are described. However, there is a demand for further development of novel luminescent materials.

Reference 4: Chinese Patent Publication No. 1084134C

As described above, the above-described metal coordination compounds for use in phosphorescent devices have the problems described so far. Therefore, there is a need for materials having higher luminescence efficiency and higher chemical stability.

SUMMARY OF THE INVENTION

An object of the present invention is to provide a useful electroluminescent device.

The present invention provides an electroluminescent device having a light-emitting layer comprising at least one kind of organic compound provided between a pair of electrodes on a substrate, wherein the organic compound is a metal coordination compound including a partial structure expressed by a partial structural formula shown by the following general formula (1):

wherein Re is rhenium, CO is a carbonyl group, and n is an integer ranging from 1 to 5.

In particular, the present invention is achieved by using as the above-mentioned organic compound a metal coordination compound including a partial structure expressed by a partial structural formula shown by the following general formula (2):

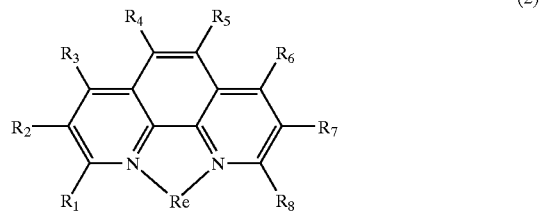

wherein Re is rhenium; and at least one of R1 to R8 is a phenyl group or a naphthyl group which may be substituted; each of the other of R1 to R8 is selected from the group consisting of an alkyl group, an alkoxyl group, a halogenated alkyl group and a halogenated alkoxyl group that are branched or straight chains and have 1 to 10 carbon atoms, a halogen atom and a hydrogen atom; a substituent of the phenyl group or naphthyl group that may be substituted is selected from the group consisting of an alkyl group, an alkoxyl group, halogenated alkyl group and a halogenated alkoxyl group that are branched or straight chains and have 1 to 10 carbon atoms, and a halogen atom.

In particular, the present invention is achieved by using as the above-mentioned organic compound a metal coordination compound including a partial structure expressed by a partial structural formula shown by the following general formula (3):

(3)

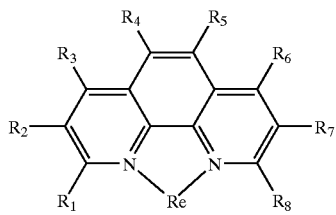

wherein Re is rhenium; and each of R1 to R8 is selected from the group consisting of an alkyl group, an alkoxyl group, a halogenated alkyl group and a halogenated alkoxyl group that are branched or straight chains and have 1 to 10 carbon atoms, a halogen atom, and a hydrogen atom.

In particular, the present invention is achieved by using as the above-mentioned organic compound a metal coordination compound including a partial structure expressed by a partial structural formula shown by the following general formula (4):

(4)

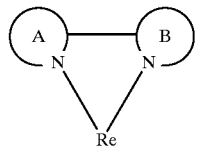

wherein Re is rhenium; and each of aromatic rings A and B is an aromatic ring having different nitrogen atoms; the aromatic ring is a pyridine ring, a quinoline ring, an isoquinoline ring or an imidazole ring which may have a substituent; a CH group of the aromatic ring may be substituted by a nitrogen atom; the substituent is selected from the group consisting of an alkyl group, an alkoxyl group, a halogenated alkyl group and a halogenated alkoxyl group that are branched or straight chains and have 1 to 10 carbon atoms, and a halogen atom.

Also, the present invention is achieved by using as the above-mentioned organic compound a metal coordination compound including a partial structure expressed by a partial structural formula shown by the following general formula (5):

(5)

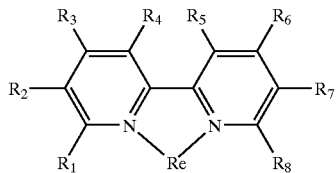

wherein Re is rhenium; and each of R1 to R8 is selected from the group consisting of an alkoxyl group, a halogenated alkyl group and a halogenated alkoxyl group that are branched or straight chains and have 1 to 10 carbon atoms, and a halogen atom, a hydrogen atom, an alkyl group which is a branched or straight chain and has 2 to 10 carbon atoms, and an aromatic group which may be substituted; a substituent of the aromatic group which may be substituted is selected from the group consisting of an alkyl group, an alkoxyl group, a halogenated alkyl group and a halogenated alkoxyl group that are branched or straight chains and have 1 to 10 carbon atoms, and a halogen atom.

In particular, the present invention is achieved by using as the above-mentioned organic compound a metal coordination compound including a partial structure expressed by a partial structural formula shown by the following general formula (6):

(6)

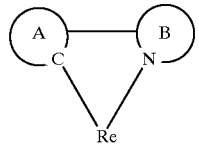

wherein Re is rhenium; an aromatic ring A is a phenyl group, a fluorene group or a naphthalene group which may have a substituent; and an aromatic ring B is a pyridine ring, a quinoline ring or an isoquinoline ring which may have a substituent; a CH group of each of the aromatic rings A and B may be substituted by a nitrogen atom; the substituent of each of the aromatic rings A and B is selected from the group consisting of an alkyl group, an alkoxyl group, a halogenated alkyl group and a halogenated alkoxyl group that are branched or straight chains and have 1 to 10 carbon atoms, a halogen atom and a disubstituted amine group (a substituent of the substituted amine group is a phenyl group or an alkyl group having 1 to 10 carbon atoms).

In particular, the present invention is achieved by using as the above-mentioned organic compound a metal coordination compound including a partial structure expressed by a partial structural formula shown by the following general formula (7):

(7)

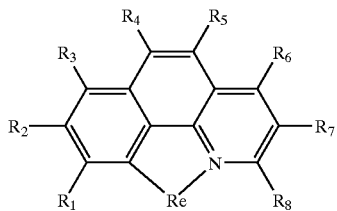

wherein Re is rhenium; and each of R1 to R8 is selected from the group consisting of a phenyl group which may be substituted, an alkyl group, an alkoxyl group, a halogenated alkyl group and a halogenated alkoxyl group that are branched or straight chains and have 1 to 10 carbon atoms, a halogen atom and a hydrogen atom; a substituent of the phenyl group which may be substituted is selected from the group consisting of an alkyl group, an alkoxyl group, a halogenated alkyl group and a halogenated alkoxyl group that are branched or straight chains and have 1 to 10 carbon atoms, and a halogen atom.

In particular, the present invention is achieved by using as the above-mentioned organic compound a metal coordination compound including a partial structure expressed by a partial structural formula shown by the following general formula (8):

(8)

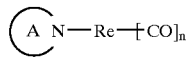

wherein an aromatic ring A containing nitrogen is a pyridine ring, a quinoline ring or an isoquinoline ring which may have a substituent, and a heterocyclic ring in which one or more of the CH groups of these rings may be substituted by a nitrogen atom; the substituent is selected from the group consisting of a halogen atom, an alkyl group having a branched or straight chain of 1 to 10 carbon atoms (in the alkyl group, at least one methylene group or a plurality of methylene groups not adjacent to each other may be substituted by —O—, —S—, —CO—, —COO—, —OCO—, —CH═CH— or —C≡C—, and a hydrogen atom in the alkyl group may be substituted by a fluorine atom), and an aromatic ring group which may be substituted (a substituent of the aromatic ring is selected from the group consisting of a halogen atom, an alkyl group having a branched or straight chain of 1 to 10 carbon atoms, an alkoxyl group having a branched or straight chain of 1 to 10 carbon atoms, and an aromatic ring group which may be substituted).

In particular, the present invention is achieved by the luminescence of the electroluminescent device being phosphorescence.

In particular, the present invention is achieved by using the light-emitting layer consisting of only the metal coordination compound including the partial structure expressed by the partial structural formula shown by the general formula (1).

Another object of the present invention is to provide a useful display apparatus.

The present invention provides a display apparatus comprising the above-described electroluminescent device and means for applying an electric field to the electroluminescent device.

BRIEF DESCRIPTION OF THE DRAWINGS

FIG. 3 is a diagram showing chemical structural formulae of conventional organic EL materials;

FIG. 6 is a diagram showing chemical structural formulae of bidentate ligands formed of phenylpyridine and benzoquinoline derivatives used in the present invention;

FIG. 7 is a diagram showing chemical structural formulae of bidentate ligands formed of phenylpyridine and benzoquinoline derivatives used in the present invention;

FIG. 18 is a cross-sectional view of the structure of a TFT portion of the active-matrix luminescent device used in the present invention;

FIG. 21 is a diagram showing exemplary compounds 350 and 351 for use in the present invention.

DETAILED DESCRIPTION OF THE PREFERRED EMBODIMENTS

In a case where a light-emitting layer consists of a host material having a carrier-transport characteristic and a guest material having a phosphorescent characteristic, a main process from triplet excitons to emission of light by phosphorescence includes several processes shown below:

1. Transport of electrons/holes in the light-emitting layer,

2. Generation of excitons in the host,
3. Transmission of excitation energy between the hosts,
4. Transfer of excitation energy from the host to the guest,
5. Generation of triplet excitons in the guest,
6. Triplet excitons in the guest→phosphorescence at the time of transition to the ground state.

The desired energy transfer and luminescence in these processes are caused in competition with various deactivation processes. To improve the luminescence efficiency of an EL device, a large luminescence quantum yield of the luminescence center material in itself is of course required. However, it is also important to improve the efficiency of energy transfer between the hosts or between the hosts and the guests.

The mechanism of generation of excitons by direct recombination of electrons and holes on the guest should be taken into consideration as well as the above-described luminescence mechanism by which excitons are produced in the host. A mode in which excitons are produced in the hosts and energy is transferred to the guest to produce excitons in the guest is called indirect excitation, while a mode in which the guest is directly excited is called direct excitation. It is difficult to experimentally identify direct excitation or indirect excitation when direct excitation or indirect excitation occurs. However, either a phenomenon in which one of these kinds of excitation is caused or a phenomenon in which both of these kinds of excitation are mixed occurs.

The rhenium complex used in the present invention emits light by phosphorescence, and its lowest excited state is considered to be MLCT* (metal-to-ligand charge transfer) excited state in a triplet state or a $\pi\pi^*$ excited state in which $\pi$-electrons in a ligand is involved. Phosphorescence occurs at the time of transition from this state to the ground state.

Figure 10:
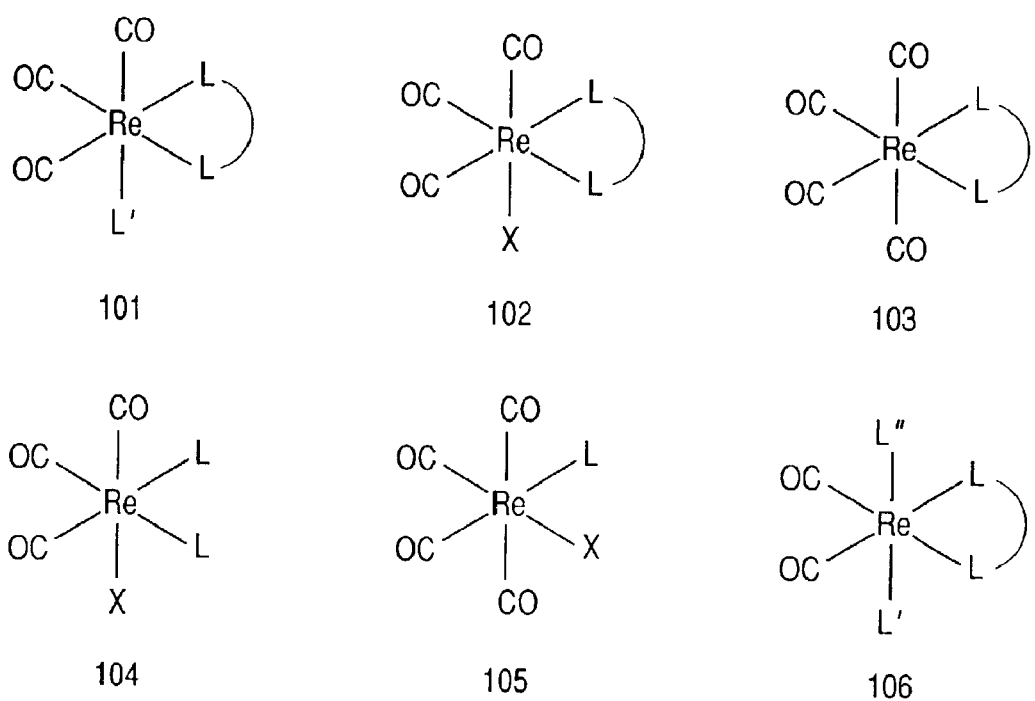
FIG. 10 is a diagram showing chemical structural formulae as general formulae of rhenium metal coordination compounds used in the present invention.

Rhenium is a transition metal in the sixth period having a high heavy-atom effect and having a phosphorescent property. FIG. 10 shows an example of general formulae of rhenium metal coordination compounds used in the present invention.

Specific examples of ligands used in the present invention will be described. Needless to say, the compounds in accordance with the present invention are not limited to those described below.

In FIG. 10, each of L, LL' and LL represent a monodentate or bidentate ligand having a $\pi$-conjugate system, and X represents a halogen atom, triallylphosphine, trialkylphosphine or the like.

Figure 11:
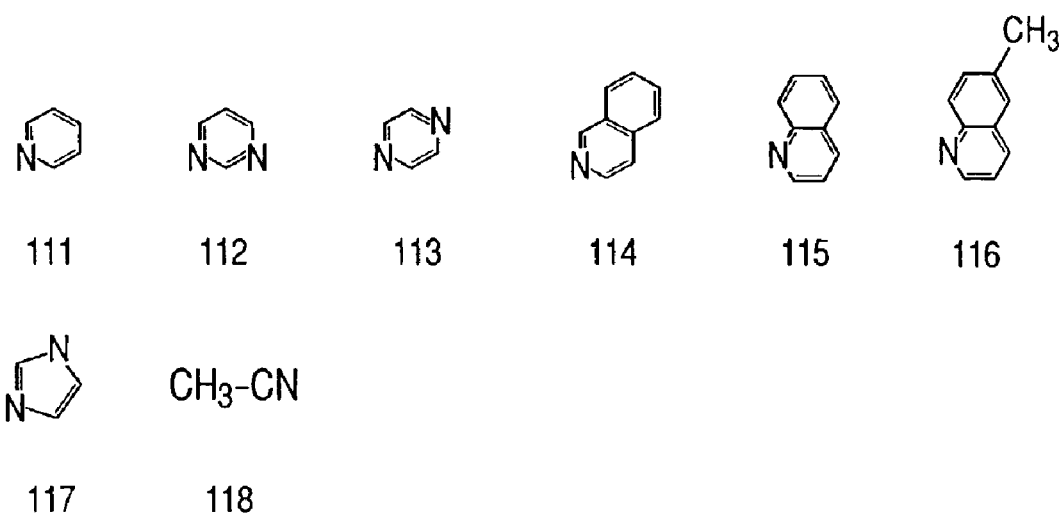
FIG. 11 is a diagram showing chemical structural formulae of monodentate ligands used in the present invention.

FIG. 11 shows examples of L, which shows monodentate ligands used in the present invention. Those are pyridine, quinoline, isoquinoline, and compounds each obtained by substituting the CH group with a nitrogen atom. The nitrogen atom in each of these aromatic rings is coordinated with Re.

Figure 4:
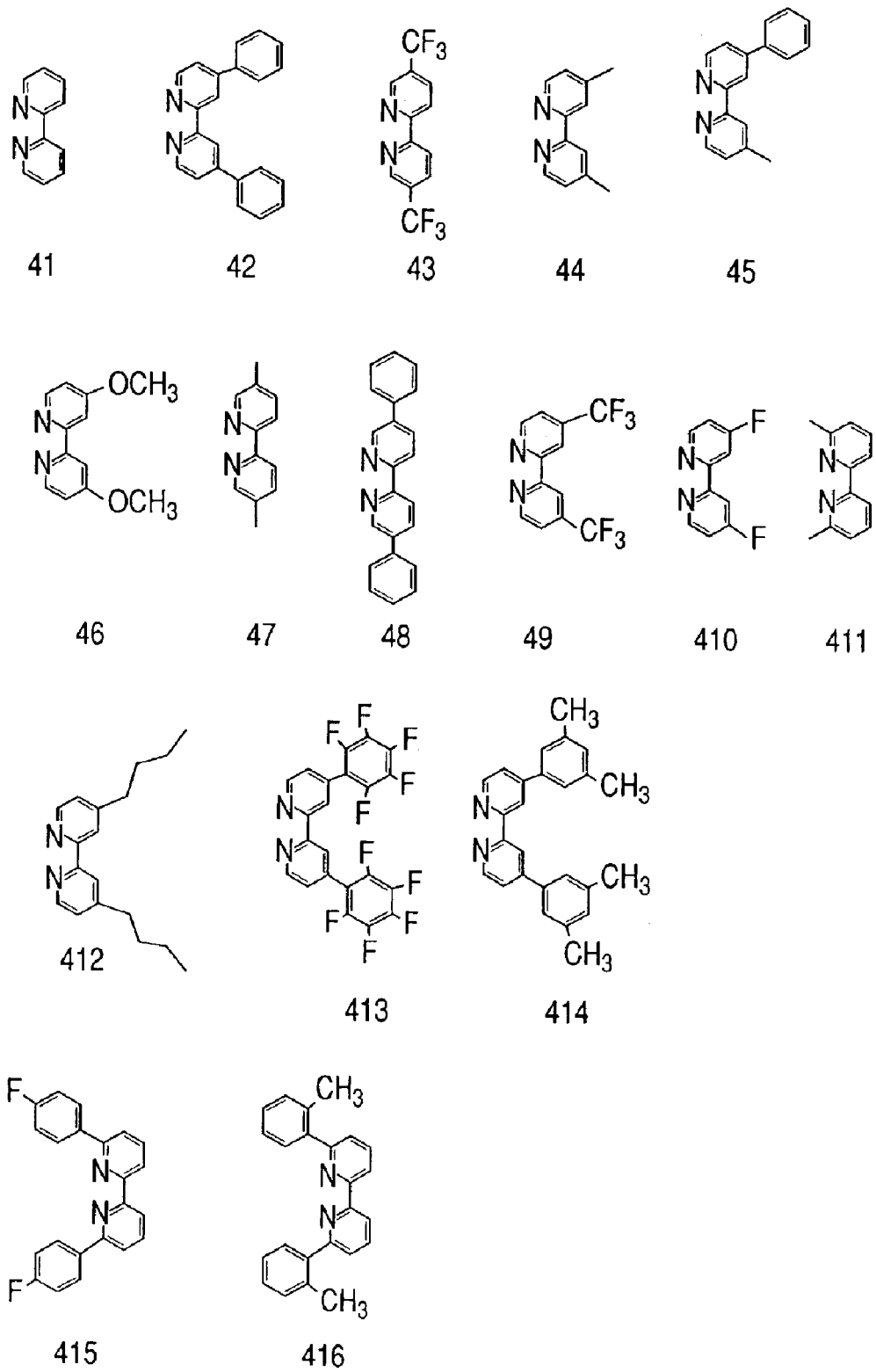
FIG. 4 is a diagram showing chemical structural formulae of ligands used in the present invention.
Figure 5:
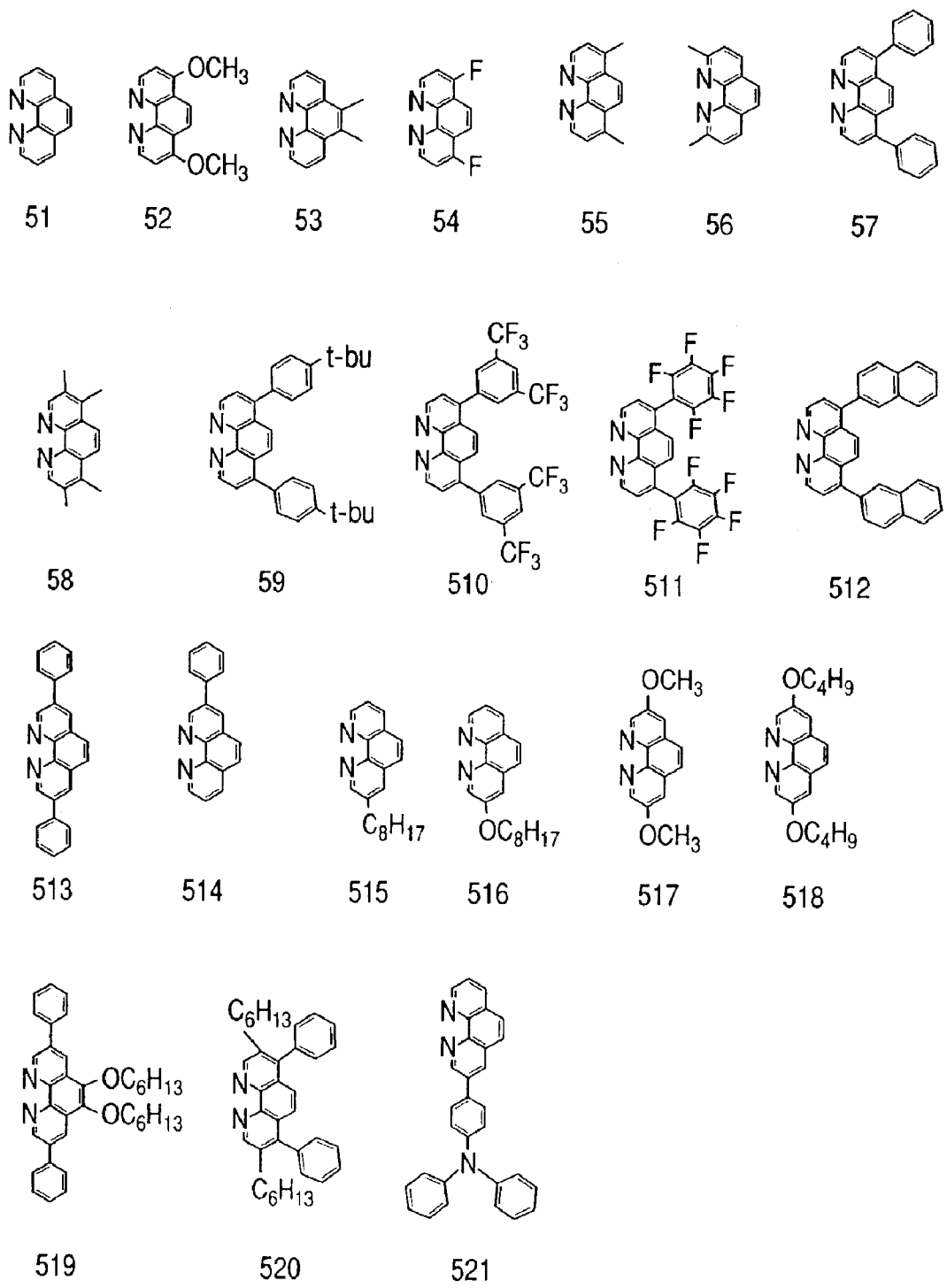
FIG. 5 is a diagram showing chemical structural formulae of ligands used in the present invention.
Figure 8:
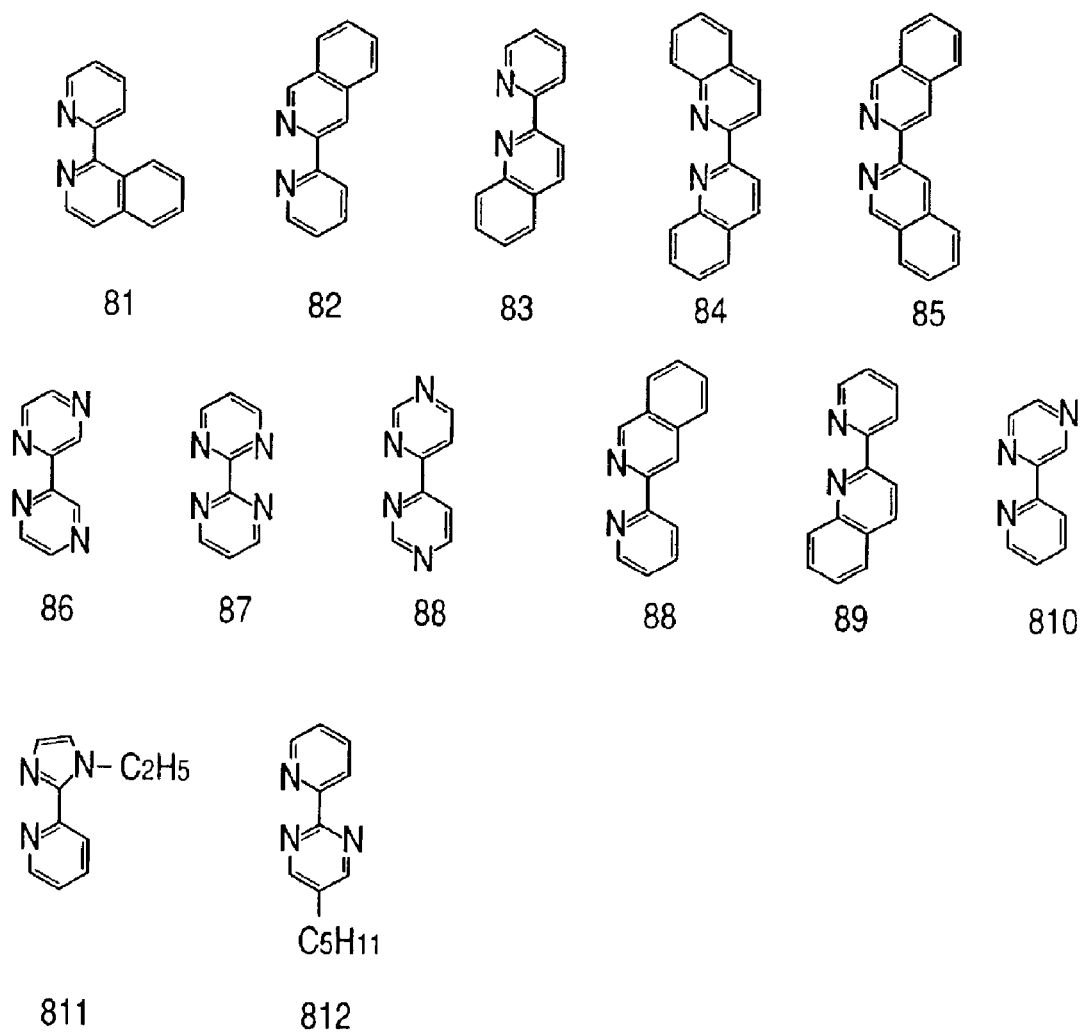
FIG. 8 is a diagram showing chemical structural formulae of ligands used in the present invention.

FIGS. 4, 5, and 8 show examples of LL. FIG. 4 shows 2,2'-bipyridine and compounds each obtained by providing a substituent in 2,2'-bipyridine. FIG. 5 shows phenanthroline and compounds each obtained by providing a substituent in phenanthroline.

In the compounds shown in FIGS. 4 and 5, two nitrogen atoms in the aromatic ring in bipyridine or phenanthroline functions as a bidentate ligand coordinated with Re. The substituents have various functions. For example, if an electron-withdrawing or electron-donating group is used, a change can be made in luminescence wavelength or luminescence characteristic. Also, the intermolecular interaction between adjacent molecules can be controlled to improve the luminescence efficiency.

With respect to a light-emitting layer conventionally formed by dispersing a luminescent guest material in an electroconductive host material, a phenomenon has been known in which the luminescence intensity is reduced when the amount of the guest dispersed is increased. This phenomenon is generally called concentration quenching. This phenomenon is thought to be caused by transferring excitation energy by interaction between molecules in neighboring luminescent material, thereby reducing the energy for luminescence.

It is possible to prevent the concentration quenching by controlling intermolecular interaction which is thought to be the cause of the concentration quenching. Thus, a high-efficiency electro-luminescent device can be obtained even in a case where the light-emitting layer is formed by using the Re compound at a high concentration or 100% of the Re coordination compound without using host molecules. Also, when intermolecular interaction is weakened, the sublimation temperature is reduced and decomposition at the time of vacuum deposition is thereby prevented, thus achieving stable deposited-film formation.

FIG. 8 shows examples of bidentate ligands formed of condensation heterocyclic compounds or heterocyclic compounds in which a plurality of nitrogen atoms are substituted. Ligands having an increased conjugate length like exemplary ligands 81 to 85, 88 and 89 are capable of increasing the luminescence wavelength.

When the number of nitrogen atoms in the aromatic ring is increased as in the ligands 86 to 88, the electronic affinity is increased and the ligands facilitate to receive electrons. In such a case, charge transfer from the central metal to the ligand is easily effected and it is easier to realize the MLCT* excited state where the luminescence efficiency is high. From the experiences, in the case of phenanthroline or pyridine shown in FIG. 4 or 5, which has a structure with a high degree of symmetry, the concentration quenching easily generates because of its symmetry. In many cases of use at a high concentration or 100% in the light-emitting layer, a substituent is required. Examples of such cases are shown in FIGS. 4 and 5. On the other hand, of the ligands shown in FIGS. 8 and 9, those having an aromatic group structure with a low degree of symmetry (81 to 83 and 91 to 97) do not always cause notable concentration quenching in many cases even without a substituent, probably because crystallization or stacking is limited due to the low degree of symmetry.

Figure 9:
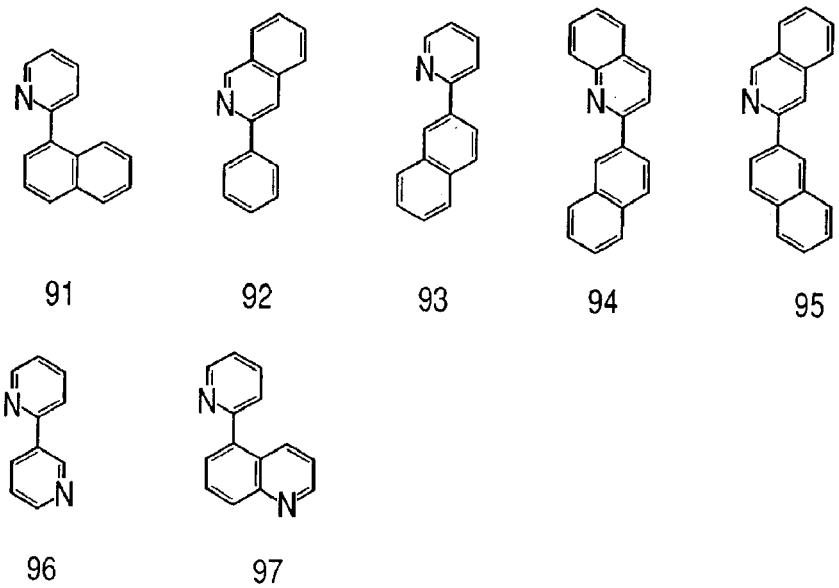
FIG. 9 is a diagram showing chemical structural formulae of bidentate ligands formed of phenylpyridine and benzoquinoline derivatives used in the present invention.

FIGS. 6, 7, and 9 show bidentate ligands formed of phenylpyridine and benzoquinoline derivatives. A nitrogen atom of the aromatic ring and a carbon atom of the aromatic ring in these ligands are coordinated with a Re atom. Since the carbon atom is directly coordinated, one hydrogen is dehydrated from each of these ligands. Therefore each of these ligands acts as a monovalent negative ion.

Tables 1 to 10 show a number of examples of metal coordination compounds used in the present invention. In the Re coordination compounds listed below, Re(1) is a monovalent cation, appended "PPh3" denotes triphenylphosphine, and "P($C_2H_5$)$_3$" and "P(O$C_2H_5$)$_3$" denote triethylphosphine and triethoxyphosphine, respectively.

Exemplary ligands shown in Tables 1 to 10 are indicated by ligand numbers shown in FIGS. 4 to 9 and 11. While only part of the examples of the ligands is shown in the tables, ligands such as those shown in the drawings or these ligands further having other substituents may also be used.

The compounds shown in the tables include electrically neutral ones and ones having a monovalent plus charge.

Those having a monovalent plus charge require a counter anion. For example, $ClO_4^-$, $PF_6^-$, $CF_3SO_3^-$ and $B(Ph)_4^-$ can be mentioned, but not limited thereto.

The numbers of exemplary compounds synthesized in Examples are shown by the numbers in the "Number" column of Tables 1 to 10.

TABLE 1

| Number | Compound type | (CO)n | LL or L | L' | X | Example |
|---|---|---|---|---|---|---|
| 1 | 102 | 3 | 41 | — | Cl | 1, 2, 3, 5 |
| 2 | 102 | 3 | 42 | — | Cl | |
| 3 | 102 | 3 | 43 | — | Cl | 19 |
| 4 | 102 | 3 | 44 | — | Cl | |
| 5 | 102 | 3 | 45 | — | Cl | |
| 6 | 102 | 3 | 46 | — | Cl | |
| 7 | 102 | 3 | 47 | — | Cl | |
| 8 | 102 | 3 | 48 | — | Cl | |
| 9 | 102 | 3 | 49 | — | Cl | 20 |
| 10 | 102 | 3 | 410 | — | Cl | |
| 11 | 102 | 3 | 411 | — | Cl | |
| 12 | 102 | 3 | 412 | — | Cl | |
| 13 | 102 | 3 | 413 | — | Cl | |
| 14 | 102 | 3 | 414 | — | Cl | |
| 15 | 102 | 3 | 51 | — | Cl | |
| 16 | 102 | 3 | 52 | — | Cl | |
| 17 | 102 | 3 | 53 | — | Cl | 32, 33 |
| 18 | 102 | 3 | 54 | — | Cl | |
| 19 | 102 | 3 | 55 | — | Cl | |
| 20 | 102 | 3 | 56 | — | Cl | |
| 21 | 102 | 3 | 57 | — | Cl | 34, 35 |
| 22 | 102 | 3 | 58 | — | Cl | 7 |
| 23 | 102 | 3 | 59 | — | Cl | 13 |
| 24 | 102 | 3 | 510 | — | Cl | 14 |
| 25 | 102 | 3 | 511 | — | Cl | 16 |
| 26 | 102 | 3 | 512 | — | Cl | 15 |
| 27 | 102 | 3 | 513 | — | Cl | 9 |
| 28 | 102 | 3 | 514 | — | Cl | 8 |
| 29 | 102 | 3 | 515 | — | Cl | |
| 30 | 102 | 3 | 516 | — | Cl | 11 |
| 31 | 102 | 3 | 517 | — | Cl | |
| 32 | 102 | 3 | 518 | — | Cl | 10 |
| 33 | 102 | 3 | 519 | — | Cl | 12 |
| 34 | 102 | 3 | 520 | — | Cl | 22 |
| 35 | 102 | 3 | 81 | — | Cl | 17 |
| 36 | 102 | 3 | 82 | — | Cl | |
| 37 | 102 | 3 | 83 | — | Cl | 18 |
| 38 | 102 | 3 | 84 | — | Cl | |
| 39 | 102 | 3 | 85 | — | Cl | |
| 40 | 102 | 3 | 86 | — | Cl | |
| 41 | 102 | 3 | 87 | — | Cl | 25 |
| 42 | 102 | 3 | 88 | — | Cl | |
| 43 | 102 | 3 | 89 | — | Cl | |
| 44 | 102 | 3 | 810 | — | Cl | |
| 45 | 102 | 3 | 811 | — | Cl | 21 |
| 46 | 102 | 3 | 812 | — | Cl | 24 |
| 47 | 102 | 3 | 41 | — | Br | |
| 48 | 102 | 3 | 42 | — | Br | |
| 49 | 102 | 3 | 43 | — | Br | |
| 50 | 102 | 3 | 44 | — | Br | |

TABLE 2

| Number | Compound type | (CO)n | LL or L | L' | X |
|---|---|---|---|---|---|
| 51 | 102 | 3 | 45 | — | Br |
| 52 | 102 | 3 | 46 | — | Br |
| 53 | 102 | 3 | 47 | — | Br |
| 54 | 102 | 3 | 48 | — | Br |
| 55 | 102 | 3 | 49 | — | Br |
| 56 | 102 | 3 | 410 | — | Br |
| 57 | 102 | 3 | 411 | — | Br |
| 58 | 102 | 3 | 412 | — | Br |
| 59 | 102 | 3 | 413 | — | Br |
| 60 | 102 | 3 | 414 | — | Br |
| 61 | 102 | 3 | 51 | — | Br |
| 62 | 102 | 3 | 52 | — | Br |
| 63 | 102 | 3 | 53 | — | Br |
| 64 | 102 | 3 | 54 | — | Br |
| 65 | 102 | 3 | 55 | — | Br |
| 66 | 102 | 3 | 56 | — | Br |
| 67 | 102 | 3 | 57 | — | Br |
| 68 | 102 | 3 | 58 | — | Br |
| 69 | 102 | 3 | 59 | — | Br |
| 70 | 102 | 3 | 510 | — | Br |
| 71 | 102 | 3 | 511 | — | Br |
| 72 | 102 | 3 | 512 | — | Br |
| 73 | 102 | 3 | 513 | — | Br |
| 74 | 102 | 3 | 514 | — | Br |
| 75 | 102 | 3 | 515 | — | Br |
| 76 | 102 | 3 | 516 | — | Br |
| 77 | 102 | 3 | 517 | — | Br |
| 78 | 102 | 3 | 518 | — | Br |
| 79 | 102 | 3 | 519 | — | Br |
| 80 | 102 | 3 | 520 | — | Br |
| 81 | 102 | 3 | 81 | — | Br |
| 82 | 102 | 3 | 82 | — | Br |
| 83 | 102 | 3 | 83 | — | Br |
| 84 | 102 | 3 | 84 | — | Br |
| 85 | 102 | 3 | 85 | — | Br |
| 86 | 102 | 3 | 86 | — | Br |
| 87 | 102 | 3 | 87 | — | Br |
| 88 | 102 | 3 | 88 | — | Br |
| 89 | 102 | 3 | 89 | — | Br |
| 90 | 102 | 3 | 810 | — | Br |
| 91 | 102 | 3 | 811 | — | Br |
| 92 | 102 | 3 | 812 | — | Br |

TABLE 3

| Number | Compound type | (CO)n | LL or L | L' | X | Example |
|---|---|---|---|---|---|---|
| 93 | 103 | 4 | 61 | — | — | |
| 94 | 103 | 4 | 62 | — | — | |
| 95 | 103 | 4 | 63 | — | — | |
| 96 | 103 | 4 | 64 | — | — | |
| 97 | 103 | 4 | 65 | — | — | |
| 98 | 103 | 4 | 66 | — | — | |
| 99 | 103 | 4 | 67 | — | — | |
| 100 | 103 | 4 | 68 | — | — | |
| 101 | 103 | 4 | 69 | — | — | |
| 102 | 103 | 4 | 610 | — | — | |
| 103 | 103 | 4 | 611 | — | — | 27 |
| 104 | 103 | 4 | 612 | — | — | 26 |
| 105 | 103 | 4 | 71 | — | — | |
| 106 | 103 | 4 | 72 | — | — | |
| 107 | 103 | 4 | 73 | — | — | |
| 108 | 103 | 4 | 74 | — | — | |
| 109 | 103 | 4 | 75 | — | — | |
| 110 | 103 | 4 | 76 | — | — | |
| 111 | 103 | 4 | 77 | — | — | |
| 112 | 103 | 4 | 78 | — | — | |

TABLE 4

| Number | Compound type | (CO)n | LL or L | L' | X | Example |
|---|---|---|---|---|---|---|
| 113 | 101 | 3 | 41 | 111 | | |
| 114 | 101 | 3 | 42 | 111 | | |
| 115 | 101 | 3 | 43 | 111 | | |
| 116 | 101 | 3 | 44 | 111 | | |
| 117 | 101 | 3 | 45 | 111 | | |
| 118 | 101 | 3 | 46 | 111 | | |
| 119 | 101 | 3 | 47 | 111 | | |
| 120 | 101 | 3 | 48 | 111 | | |
| 121 | 101 | 3 | 49 | 111 | | |
| 122 | 101 | 3 | 410 | 111 | | |
| 123 | 101 | 3 | 411 | 111 | | |
| 124 | 101 | 3 | 412 | 111 | | |

TABLE 4-continued

| Number | Compound type | (CO)n | LL or L | L' | X | Example |
|---|---|---|---|---|---|---|
| 125 | 101 | 3 | 413 | 111 | | |
| 126 | 101 | 3 | 414 | 111 | | |
| 127 | 101 | 3 | 51 | 111 | | |
| 128 | 101 | 3 | 52 | 111 | | |
| 129 | 101 | 3 | 53 | 111 | | |
| 130 | 101 | 3 | 54 | 111 | | |
| 131 | 101 | 3 | 55 | 111 | 4 | |
| 132 | 101 | 3 | 56 | 111 | | |
| 133 | 101 | 3 | 57 | 111 | | |
| 134 | 101 | 3 | 58 | 111 | 23 | |
| 135 | 101 | 3 | 59 | 111 | | |
| 136 | 101 | 3 | 510 | 111 | | |
| 137 | 101 | 3 | 511 | 111 | | |
| 138 | 101 | 3 | 512 | 111 | | |
| 139 | 101 | 3 | 513 | 111 | | |
| 140 | 101 | 3 | 514 | 111 | | |
| 141 | 101 | 3 | 515 | 111 | | |
| 142 | 101 | 3 | 516 | 111 | | |
| 143 | 101 | 3 | 517 | 111 | | |
| 144 | 101 | 3 | 518 | 111 | | |
| 145 | 101 | 3 | 519 | 111 | | |
| 146 | 101 | 3 | 520 | 111 | | |
| 147 | 101 | 3 | 81 | 111 | | |
| 148 | 101 | 3 | 82 | 111 | | |
| 149 | 101 | 3 | 83 | 111 | | |
| 150 | 101 | 3 | 84 | 111 | | |
| 151 | 101 | 3 | 85 | 111 | | |
| 152 | 101 | 3 | 86 | 111 | | |
| 153 | 101 | 3 | 87 | 111 | | |
| 154 | 101 | 3 | 88 | 111 | | |
| 155 | 101 | 3 | 89 | 111 | | |
| 156 | 101 | 3 | 810 | 111 | | |
| 157 | 101 | 3 | 811 | 111 | | |
| 158 | 101 | 3 | 812 | 111 | | |
| 159 | 101 | 3 | 41 | 111 | | |
| 160 | 101 | 3 | 42 | 111 | | |
| 161 | 101 | 3 | 43 | 111 | | |
| 162 | 101 | 3 | 44 | 111 | | |

TABLE 5

| Number | Compound type | (CO)n | LL or L | L' | X |
|---|---|---|---|---|---|
| 163 | 101 | 3 | 45 | 111 | |
| 164 | 101 | 3 | 46 | 111 | |
| 165 | 101 | 3 | 47 | 111 | |
| 166 | 101 | 3 | 48 | 111 | |
| 167 | 101 | 3 | 49 | 111 | |
| 168 | 101 | 3 | 410 | 111 | |
| 169 | 101 | 3 | 411 | 111 | |
| 170 | 101 | 3 | 412 | 111 | |
| 171 | 101 | 3 | 413 | 111 | |
| 172 | 101 | 3 | 414 | 111 | |
| 173 | 101 | 3 | 51 | 111 | |
| 174 | 101 | 3 | 52 | 111 | |
| 175 | 101 | 3 | 53 | 111 | |
| 176 | 101 | 3 | 54 | 111 | |
| 177 | 101 | 3 | 55 | 111 | |
| 178 | 101 | 3 | 56 | 111 | |
| 179 | 101 | 3 | 57 | 111 | |
| 180 | 101 | 3 | 58 | 111 | |
| 181 | 101 | 3 | 59 | 111 | |
| 182 | 101 | 3 | 510 | 111 | |
| 183 | 101 | 3 | 511 | 111 | |
| 184 | 101 | 3 | 512 | 111 | |
| 185 | 101 | 3 | 513 | 111 | |
| 186 | 101 | 3 | 514 | 111 | |
| 187 | 101 | 3 | 515 | 111 | |
| 188 | 101 | 3 | 516 | 111 | |
| 189 | 101 | 3 | 517 | 111 | |
| 190 | 101 | 3 | 518 | 111 | |
| 191 | 101 | 3 | 519 | 111 | |
| 192 | 101 | 3 | 520 | 111 | |
| 193 | 101 | 3 | 81 | 111 | |

TABLE 5-continued

| Number | Compound type | (CO)n | LL or L | L' | X |
|---|---|---|---|---|---|
| 194 | 101 | 3 | 82 | 111 | |
| 195 | 101 | 3 | 83 | 111 | |
| 196 | 101 | 3 | 84 | 111 | |
| 197 | 101 | 3 | 85 | 111 | |
| 198 | 101 | 3 | 86 | 111 | |
| 199 | 101 | 3 | 87 | 111 | |
| 200 | 101 | 3 | 88 | 111 | |
| 201 | 101 | 3 | 89 | 111 | |
| 202 | 101 | 3 | 810 | 111 | |
| 203 | 101 | 3 | 811 | 111 | |
| 204 | 101 | 3 | 812 | 111 | |
| 205 | 101 | 3 | 41 | 117 | |
| 206 | 101 | 3 | 42 | 117 | |
| 207 | 101 | 3 | 43 | 117 | |
| 208 | 101 | 3 | 44 | 117 | |
| 209 | 101 | 3 | 45 | 117 | |
| 210 | 101 | 3 | 46 | 117 | |
| 211 | 101 | 3 | 47 | 117 | |
| 212 | 101 | 3 | 48 | 117 | |
| 213 | 101 | 3 | 49 | 117 | |

TABLE 6

| Number | Compound type | (CO)n | LL or L | L' |
|---|---|---|---|---|
| 214 | 101 | 3 | 410 | 117 |
| 215 | 101 | 3 | 411 | 117 |
| 216 | 101 | 3 | 412 | 117 |
| 217 | 101 | 3 | 413 | 117 |
| 218 | 101 | 3 | 414 | 117 |
| 219 | 101 | 3 | 51 | 117 |
| 220 | 101 | 3 | 52 | 117 |
| 221 | 101 | 3 | 53 | 117 |
| 222 | 101 | 3 | 54 | 117 |
| 223 | 101 | 3 | 55 | 117 |
| 224 | 101 | 3 | 56 | 117 |
| 225 | 101 | 3 | 57 | 117 |
| 226 | 101 | 3 | 58 | 117 |
| 227 | 101 | 3 | 59 | 117 |
| 228 | 101 | 3 | 510 | 117 |
| 229 | 101 | 3 | 511 | 117 |
| 230 | 101 | 3 | 512 | 117 |
| 231 | 101 | 3 | 513 | 117 |
| 232 | 101 | 3 | 514 | 117 |
| 233 | 101 | 3 | 515 | 117 |
| 234 | 101 | 3 | 516 | 117 |
| 235 | 101 | 3 | 517 | 117 |
| 236 | 101 | 3 | 518 | 117 |
| 237 | 101 | 3 | 519 | 117 |
| 238 | 101 | 3 | 520 | 117 |
| 239 | 101 | 3 | 81 | 117 |
| 240 | 101 | 3 | 82 | 117 |
| 241 | 101 | 3 | 83 | 117 |
| 242 | 101 | 3 | 84 | 117 |
| 243 | 101 | 3 | 85 | 117 |
| 244 | 101 | 3 | 86 | 117 |
| 245 | 101 | 3 | 87 | 117 |
| 246 | 101 | 3 | 88 | 117 |
| 247 | 101 | 3 | 89 | 117 |
| 248 | 101 | 3 | 810 | 117 |
| 249 | 101 | 3 | 811 | 117 |
| 250 | 101 | 3 | 812 | 117 |
| 251 | 101 | 3 | 41 | 117 |
| 252 | 101 | 3 | 42 | 117 |
| 253 | 101 | 3 | 43 | 117 |
| 254 | 101 | 3 | 44 | 117 |
| 255 | 101 | 3 | 45 | 117 |
| 256 | 101 | 3 | 46 | 117 |
| 257 | 101 | 3 | 47 | 117 |
| 258 | 101 | 3 | 48 | 117 |
| 259 | 101 | 3 | 49 | 117 |

TABLE 7

| Number | Compound type | (CO)n | LL or L | L' | Example |
|---|---|---|---|---|---|
| 260 | 101 | 3 | 410 | 117 | |
| 261 | 101 | 3 | 411 | 117 | |
| 262 | 101 | 3 | 412 | 117 | |
| 263 | 101 | 3 | 413 | 117 | |
| 264 | 101 | 3 | 414 | 117 | |
| 265 | 101 | 3 | 51 | 117 | |
| 266 | 101 | 3 | 52 | 117 | |
| 267 | 101 | 3 | 53 | 117 | |
| 268 | 101 | 3 | 54 | 117 | |
| 269 | 101 | 3 | 55 | 117 | |
| 270 | 101 | 3 | 56 | 117 | |
| 271 | 101 | 3 | 57 | 117 | |
| 272 | 101 | 3 | 58 | 117 | |
| 273 | 101 | 3 | 59 | 117 | |
| 274 | 101 | 3 | 510 | 117 | |
| 275 | 101 | 3 | 511 | 117 | |
| 276 | 101 | 3 | 512 | 117 | |
| 277 | 101 | 3 | 513 | 117 | |
| 278 | 101 | 3 | 514 | 117 | |
| 279 | 101 | 3 | 515 | 117 | |
| 280 | 101 | 3 | 516 | 117 | |
| 281 | 101 | 3 | 517 | 117 | |
| 282 | 101 | 3 | 518 | 117 | |
| 283 | 101 | 3 | 519 | 117 | |
| 284 | 101 | 3 | 520 | 117 | |
| 285 | 101 | 3 | 81 | 117 | |
| 286 | 101 | 3 | 82 | 117 | |
| 287 | 101 | 3 | 83 | 117 | |
| 288 | 101 | 3 | 84 | 117 | |
| 289 | 101 | 3 | 85 | 117 | |
| 290 | 101 | 3 | 86 | 117 | |
| 291 | 101 | 3 | 87 | 117 | |
| 292 | 101 | 3 | 88 | 117 | |
| 293 | 101 | 3 | 89 | 117 | |
| 294 | 101 | 3 | 810 | 117 | |
| 295 | 101 | 3 | 811 | 117 | |
| 296 | 101 | 3 | 812 | 117 | |
| 297 | 101 | 3 | 58 | 112 | |
| 298 | 101 | 3 | 58 | 113 | |
| 299 | 101 | 3 | 58 | 114 | |
| 300 | 101 | 3 | 58 | 115 | |
| 301 | 101 | 3 | 58 | 116 | |
| 302 | 101 | 3 | 58 | 118 | 23 |

TABLE 8

| Number | Compound type | (CO)n | LL or L | L' | X |
|---|---|---|---|---|---|
| 303 | 104 | 3 | 111 | | Cl |
| 304 | 104 | 3 | 112 | | Cl |
| 305 | 104 | 3 | 113 | | Cl |
| 306 | 104 | 3 | 114 | | Cl |
| 307 | 104 | 3 | 115 | | Cl |
| 308 | 104 | 3 | 116 | | Cl |
| 309 | 104 | 3 | 117 | | Cl |
| 310 | 105 | 4 | 111 | | Cl |
| 311 | 105 | 4 | 112 | | Cl |
| 312 | 105 | 4 | 113 | | Cl |
| 313 | 105 | 4 | 114 | | Cl |
| 314 | 105 | 4 | 115 | | Cl |
| 315 | 105 | 4 | 116 | | Cl |
| 316 | 105 | 4 | 111 | | Br |
| 317 | 105 | 4 | 112 | | Br |
| 318 | 105 | 4 | 113 | | Br |
| 319 | 105 | 4 | 114 | | Br |
| 320 | 105 | 4 | 115 | | Br |
| 321 | 105 | 4 | 116 | | Br |

TABLE 9

| Number | Compound type | (CO)n | LL or L | L' | X | L" |
|---|---|---|---|---|---|---|
| 322 | 106 | 2 | 41 | P(OEt)3 | — | 118 |
| 323 | | 2 | 41 | P(OEt)3 | — | 111 |
| 324 | | 2 | 41 | P(OEt)3 | — | PPh3 |
| 325 | | 2 | 41 | P(OEt)3 | — | P(OEt)3 |
| 326 | | 2 | 41 | P(OEt)3 | Cl— | — |
| 327 | | 2 | 41 | PPh3 | — | 118 |
| 328 | | 2 | 41 | PPh3 | — | PPh3 |
| 329 | | 2 | 44 | P(OEt)3 | — | PPh3 |
| 330 | | 2 | 44 | P(OEt)3 | — | P(OEt)3 |
| 331 | | 2 | 49 | P(OEt)3 | — | P(OEt)3 |
| 332 | | 2 | 58 | P(OEt)3 | — | P(OEt)3 |
| 333 | | 2 | 58 | P(OEt)3 | — | PPh3 |
| 334 | | 2 | 58 | P(OEt)3 | Cl— | |
| 335 | | 2 | 58 | P(OEt)3 | — | 118 |
| 336 | | 2 | 58 | P(OEt)3 | — | 111 |
| 337 | | 2 | 511 | P(OEt)3 | — | P(OEt)3 |
| 338 | | 2 | 511 | P(OEt)3 | — | PPh3 |
| 339 | | 2 | 511 | P(OEt)3 | Cl— | |
| 340 | | 2 | 511 | P(OEt)3 | — | 118 |
| 341 | | 2 | 511 | P(OEt)3 | — | 111 |
| 342 | | 2 | 52 | 117 | — | P(OEt)3 |
| 343 | | 2 | 57 | 117 | — | P(OEt)3 |
| 344 | | 2 | 59 | 117 | — | P(OEt)3 |
| 345 | | 2 | 510 | 117 | — | P(OEt)3 |
| 346 | | 2 | 511 | 117 | — | P(OEt)3 |
| 347 | | 2 | 517 | 117 | — | P(OEt)3 |
| 348 | | 2 | 519 | 117 | — | P(OEt)3 |
| 349 | | 2 | 520 | 117 | — | P(OEt)3 |

TABLE 10

| Number | Compound type | (CO)n | LL or L | L' | X | Example |
|---|---|---|---|---|---|---|
| 352 | 102 | 3 | 415 | — | Cl | |
| 353 | 102 | 3 | 416 | — | Cl | 30 |
| 354 | 102 | 3 | 521 | — | Cl | 31 |
| 355 | 102 | 3 | 415 | — | Br | 28 |
| 356 | 102 | 3 | 416 | — | Br | 29 |
| 357 | 102 | 3 | 521 | — | Br | |

The Re compounds of the present invention are useful as a luminescent material for organic EL devices. They have a high luminescence efficiency and are suitable for film formation by a deposition process and for spin coating for dispersion in a polymer. When the Re compound of the present invention is used, a stable electroluminescent device can be fabricated without damaged by decomposition or the like in device fabrication steps. No problem was recognized with respect to the luminescence stability when the EL device is energized.

The Re metal coordination compound of the present invention is characterized by comprising a carbonyl group. The molecular weight of the carbonyl group portion is about 38, and the molecular weight of molecules as a whole can be reduced. Thus, one of the features of the metal coordination compound of the present invention resides in that the sublimation temperature is lower. For example, the molecular weight of the above-described Ir(ppy)3 is 655 and that of Alq3 is 459.1. Re(CO)3bpyCl shown in FIG. 12 has a molecular weight of 462.1, which is markedly small among those of phosphorescent materials using the heavy-atom effect.

Decomposition products deposited on a glass substrate during vacuum deposition were actually examined by being washed off by means of acetonitrile. The amount of decomposed impurities analyzed with a high-performance liquid chromatography was 0.1% or less.

With respect to the stability of a compound, there is a problem relating to the thermal stability of the compound during deposition or the stability during energization of the device in which the compound is used. During deposition, there is a heat resistance problem because the compound is subjected to a high temperature at the time of sublimation. The compound in the device is used in a state of being oxidized, reduced or excited. In this case, the probability of change to a different substance, for example, is a consideration.

The inventors of the present invention experimentally confirmed that the compound of the present invention was stable even under such a condition. It is, therefore, apparent that the compound of the present invention is effective in use for organic EL devices.

Further, the inventors made studies about the optical properties of the rhenium carbonyl coordination compound of the present invention to obtain a finding described below. Ir(ppy)3 which is a typical example of phosphorescent material strongly emits light in deoxidized toluene or acetonitrile, and its phosphorescence yield when it is in a solution state is 0.4 at room temperature. Ir(ppy)3 is one of the compounds having the highest phosphorescence yield.

Figure 12:
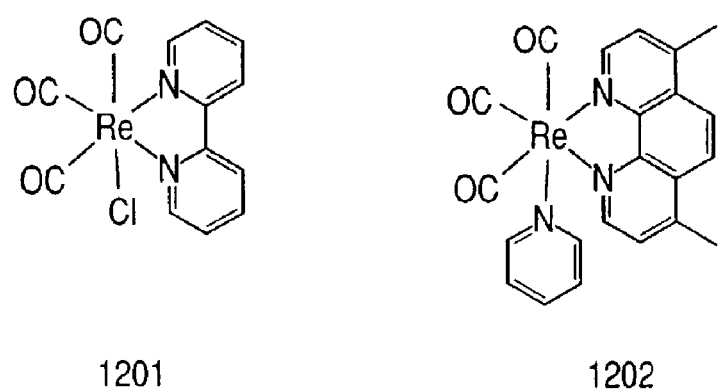
FIG. 12 is a diagram showing chemical structural formulae of ligands used in the present invention.

The luminescence yield measured under the same experimental conditions with respect to the compound 1201 (exemplary compound 29) shown in FIG. 12 is about 0.01, smaller by an order of magnitude or more. Generally speaking, when the luminescence yield is low, it is supposed that the luminescence yield of the solid film is also small. With respect to the Re compound of the present invention, contrary to the supposition, a high luminescence yield is exhibited in a solid film state.

More specifically, an experiment was made in which a deposited film having a thickness of 50 nm was formed on glass, the film was irradiated with light of 350 nm and the intensity of luminescence was observed. It was found that while Ir(ppy)3 emitted substantially no light, the compound 1201 (exemplary compound 29) strongly emitted light. This experimental result shows that concentration quenching is prevented even in a case where the Re coordination compound exists at a high concentration or 100% of it exists. The reason for low luminescence yield when the compound is in a solution state is uncertain. However, the inventors have shown that, contrary to the conventional luminescent material, when the Re compound is used in an electroluminescent device, the device can have a high luminescence yield even though the luminescence yield of the compound in a solution state is considerably low.

As described above, the Re coordination compound is strong against the concentration quenching and is therefore suitable for a light-emitting layer which is composed of the Re coordination compound at a high concentration or only the Re coordination.

Also, it has become apparent that the compound of the present invention has improved performance with respect to stability in an energization endurance test, as shown in following examples.

EXAMPLES

The present invention will be described in detail by the following examples. First, measurement methods of material properties will be described.

<Measurement Method>

(1) Method for Determination of Phosphorescence and Fluorescence

Determination of phosphorescence is performed by whether oxygen inactivation occurs or not. A compound is dissolved in chloroform, and the resultant solution with oxygen replacement and the resultant solution with nitrogen replacement are irradiated with light, then the photoluminescence of both solutions is compared. In the case where the compound is a phosphorescent substance, almost no light emission derived from the compound can be observed in the solution with oxygen replacement. On the other hand, the photoluminescence can be observed in the solution with nitrogen replacement. Thus, it can be identified which occurs, phosphorescence or fluorescence. Existence of the phosphorescence in the compounds of the present invention mentioned hereinbelow is identified by this method unless specifically noted.

(2) Luminescence Yield of Phosphorescence Used in the Present Invention is Provided in the Following Equation.

$$\Phi(sample)/\Phi(st)=[Sem(sample)/Iabs(sample)]/[Sem(st)/Iabs(st)]$$

wherein $\Phi$(sample): luminescence yield of sample $\Phi$(st): luminescence yield of standard sample Iabs (st): absorption coefficient at wavelength exciting the standard sample Sem (st): emission spectrum area intensity of the standard sample excited with the same wavelength Iabs (sample): absorption coefficient at wavelength exciting the objective compound Sem (sample): emission spectrum area intensity of the objective compound excited with the same wavelength Quantum yield of phosphorescence herein designated is indicated as the relative value when $\Phi$ of Ir(ppy)3 is defineed as the standard.

(3) A Method for Measuring a Lifetime of the Phosphorescence is as Follows.

At first, a compound was dissolved in chloroform and was spin-coated with the thickness about 0.1 $\mu$m on a quartz plate. The obtained sample was pulse-irradiated with nitrogen laser having an excitation wavelength of 337 nm at room temperature using a luminescence lifetime measurement apparatus manufactured by Hamamatsu Photonics K.K. A decay time of the luminous intensity of the sample after termination of the excited pulse was measured.

When the initial luminous intensity is $I_0$, the luminescence intensity I after t seconds can be defined as the following equation by using the emission lifetime $\tau$:

$$I=I_0\exp(-t/\tau)$$

Example 1

Exemplary compound 1 (compound 1201 in FIG. 12) was synthesized according to a report (J. Am. Chem. Soc. 101 (1979) p. 7415). Molecular weight of the synthesized final product measured by DI-MS (Direct inlet mass spectrometry) was 461.98, which indicated that the exemplary compound 1 was synthesized. Purity was measured by HPLC (high performance liquid chromatography) to confirm the purity 99.5% or more.

An organic EL device was prepared by using the synthesized exemplary compound 1 as a luminescent material. The exemplary compound 1 was confirmed to have phosphorescent property by the discriminating method described above using only the exemplary compound. The structure of the device used here was an device with 4 organic layers shown in FIG. 1C.

A hundred of ITO stripes each having a thickness of 100 nm, a width of 100 $\mu$m and an interelectrode width of 10 $\mu$m (electrode pitch 110 $\mu$m) were patterned on a glass substrate (a transparent substrate 15) having a thickness of 1.1 mm by deposition in a conventional manner.

The organic layers and the electrode layers hereinbelow were vacuum-deposited on the ITO substrate by resistive heating in the vacuum chamber at $10^{-4}$ Pa to continuously form these layers.

Organic layer 1 (40 nm): αNPD
Organic layer 2 (30 nm): CBP as a host, and exemplary compound 1 coevaporated with CBP at 7% by weight bases on CBP
Organic layer 3 (10 nm): BCP
Organic layer 4 (40 nm): Alq3
Metal electrode layer 1 (15 nm): AlLi alloy (Li content, 1.8% by weight)
Metal electrode layer 2 (100 nm): Al On the opposite side, AlLi alloy layer and Al electrode as the cathode were patterned for 100 lines with 100 μm width and interelectrode width 10 μm (electrode pitch 110 μm), and 20 (ITO)×15(Al) electrodes were bundled to prepare surface area 3 mm² of the display electrode.

Figure 13A:
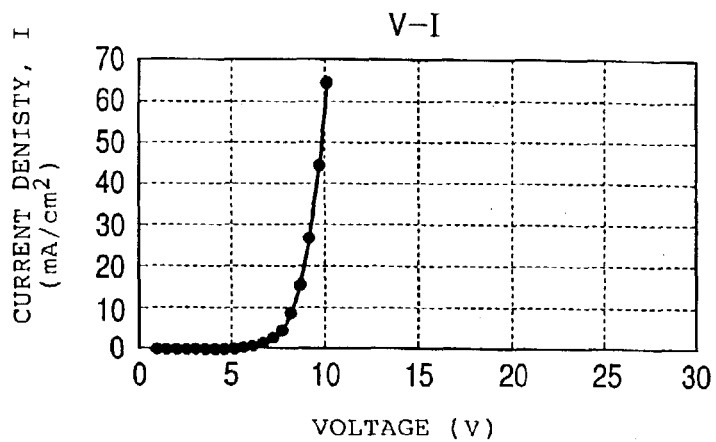
FIG. 13A is a graph showing a voltage-current characteristic of a luminescent device in Example 1.
Figure 13B:
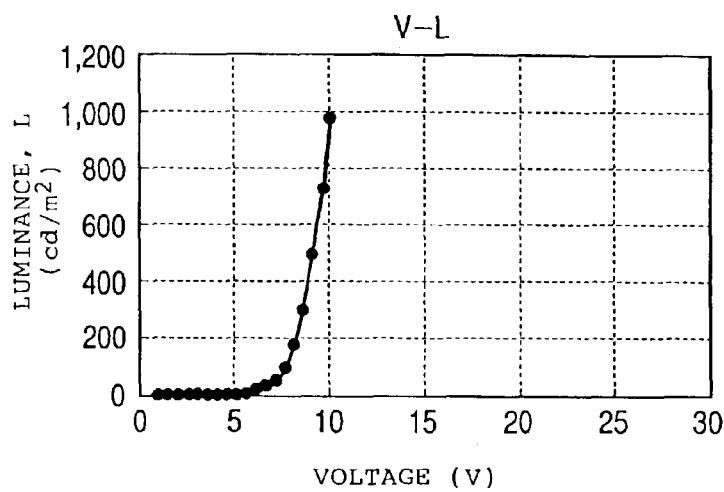
FIG. 13B is a graph showing a voltage-luminance characteristic of the luminescent device in Example 1.
Figure 13C:
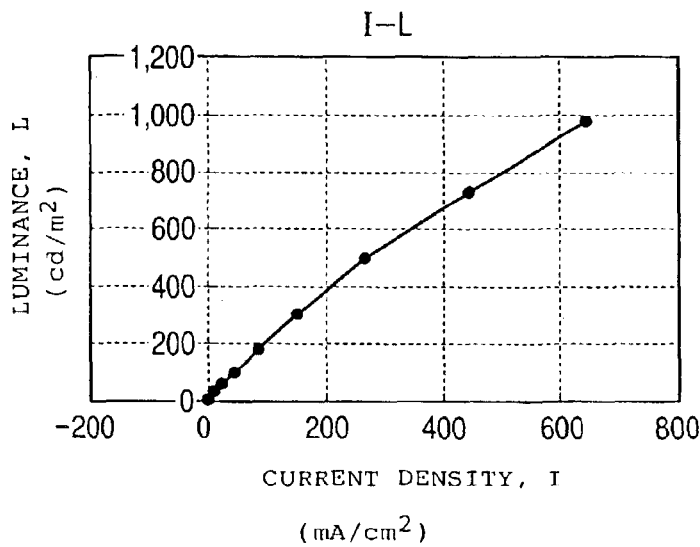
FIG. 13C is a graph showing a current-luminance characteristic of the luminescent device in Example 1.

Characteristics of the device were evaluated by applying DC voltage to Al as the negative terminal and ITO as the positive terminal, and the results are shown in FIGS. 13A, 13B and 13C. FIG. 13A indicates volt-current characteristic; FIG. 13B indicates volt-luminance characteristic; and FIG. 13C indicates current-luminance characteristic. As obvious from these graphs, good luminescent characteristics were obtained. Maximum luminous efficiency was 2.1 cd/A. At this time, a peak of the luminescence spectrum was 576 nm. The luminescence lifetime of the photoexcitation of the device at 576 nm (excitation wavelength 337.1 nm) was measured to be 0.5 μsec., and luminescence was identified as phosphorescence emission. Continuous renergization for 100 hours was conducted, and the luminance was reduced by several percentages, whereby this result indicates stable luminescent emission.

Example 2

Figure 1A:
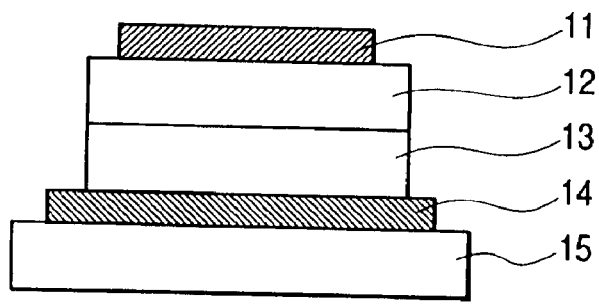
FIG. 1A is a diagram showing the construction of an organic EL device having two organic layers.
Figure 1B:
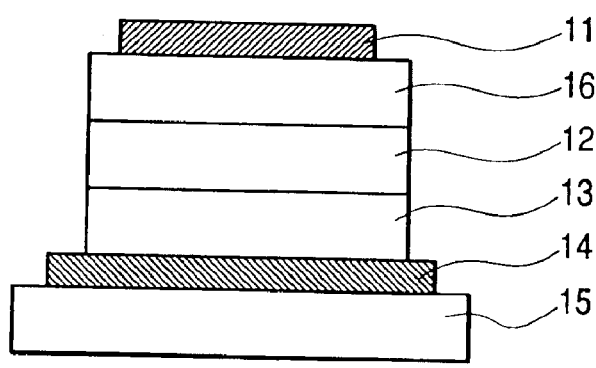
FIG. 1B is a diagram showing the construction of an organic EL device having three organic layers.
Figure 1C:
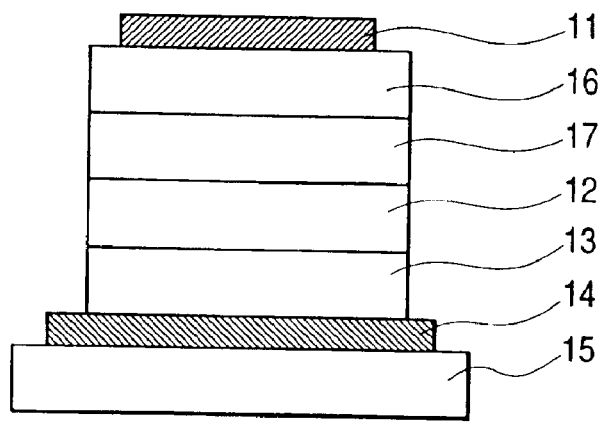
FIG. 1C is a diagram showing the construction of an organic EL device having four organic layers.

An EL device having three organic layers as shown in FIG. 1B was used. ITO having a thickness of 100 nm was patterned on a glass substrate so that the resultant opposing electrode has an area of 3 mm² similarly as in Example 1. The organic layers and the electrode layers below were continuously vacuum deposited on the ITO substrate by resistive heating in the vacuum chamber at $10^{-4}$ Pa.

Figure 2A:
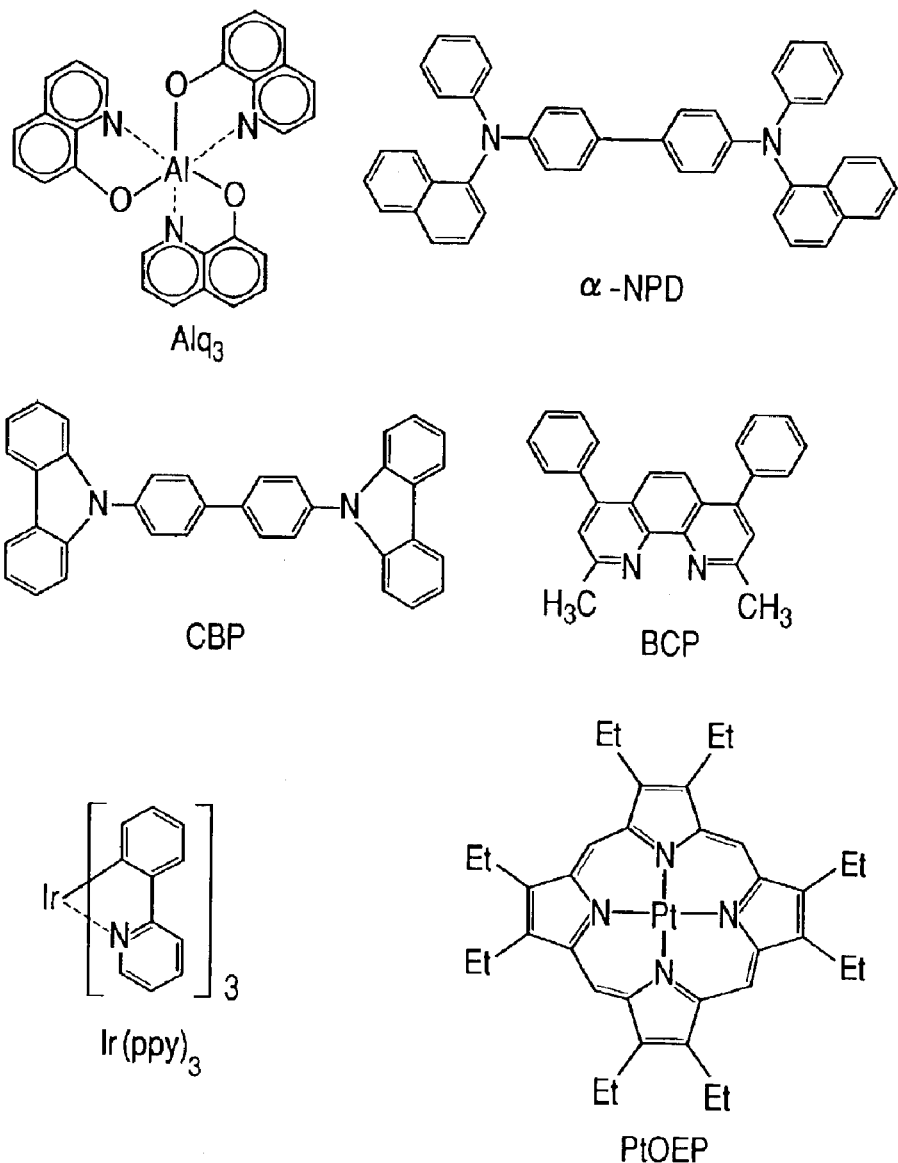
FIG. 2A is a diagram showing chemical structural formulae of Alq3, α-NPD, CBP, BCP, Ir(ppy)$_3$, which are conventional organic EL materials.
Figure 2B:
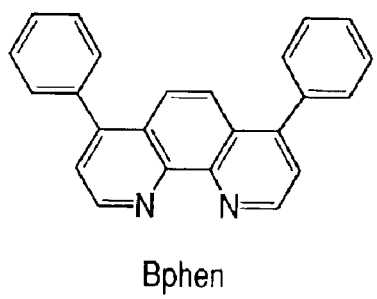
FIG. 2B is a diagram showing a chemical structural formula of Bphen, which is a conventional organic EL material.
Figure 14A:
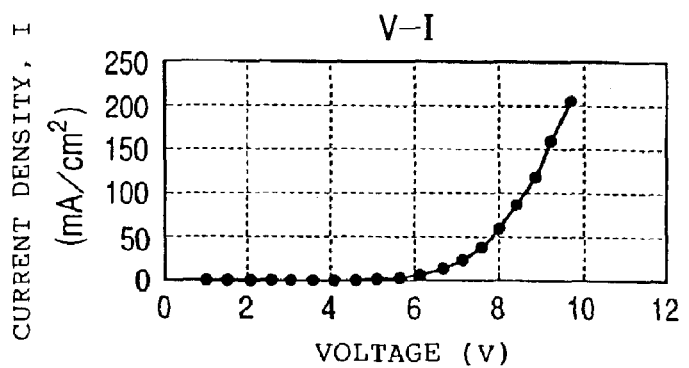
FIG. 14A is a graph showing a voltage-current characteristic of an electroluminescent device in Example 2.
Figure 14B:
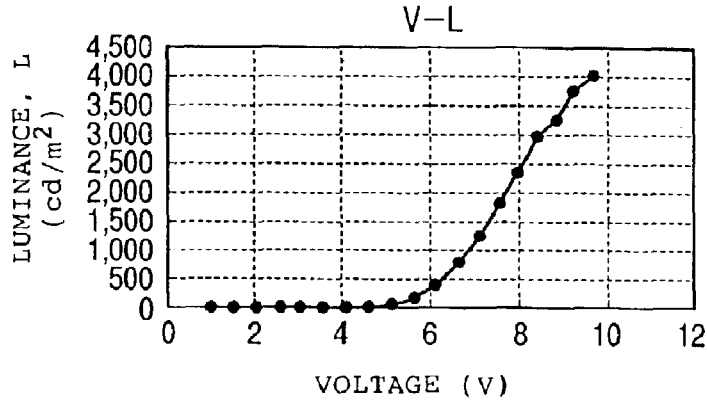
FIG. 14B is a graph showing a voltage-luminance characteristic of the electroluminescent device in Example 2.
Figure 14C:
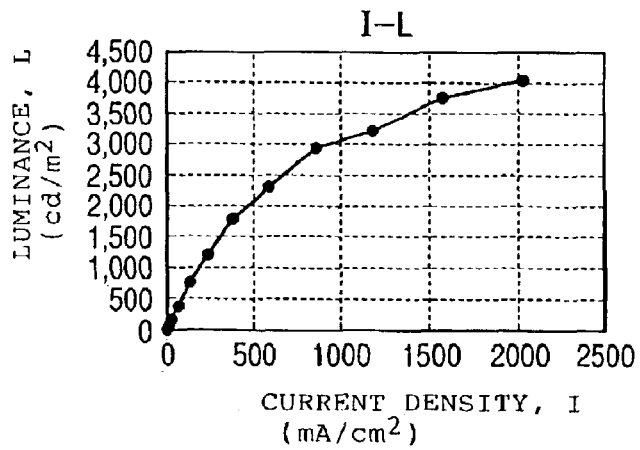
FIG. 14C is a graph showing a current-luminance characteristic of the luminescent device in Example 2.
Figure 14D:
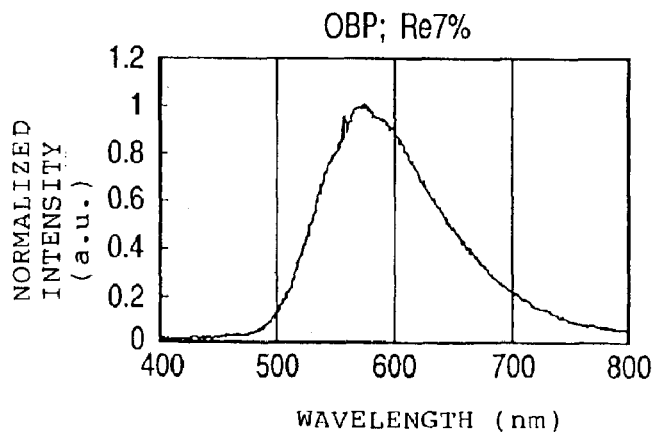
FIG. 14D is a graph showing a luminescence spectrum of the luminescent device in Example 2.

Organic layer 1 (40 nm): αNPD
Organic layer 2 (40 nm): CBP as a host, and exemplary compound 1 coevaporated with CBP at 7% by weight based on CBP
Organic layer 3 (50 nm): Bphen (shown in FIG. 2)
Metal electrode layer 1 (1 nm): KF
Metal electrode layer 2 (100 nm): Al Characteristics of the device were evaluated by applying DC voltage to Al as the negative terminal and ITO as the positive terminal, and the results are shown in FIGS. 14A to 14D. FIG. 14A indicated volt-current characteristic; FIG. 14B indicates volt-luminance characteristic; and FIG. 14C indicates current-luminance characteristic. As obvious from these graphs, good luminescence characteristics were obtained. FIG. 14D shows the luminescence spectrum. Maximum luminous efficiency was 6.3 cd/A. At this time, a peak of the luminescence spectrum was 578 nm.

Example 3

An EL device having three organic layers as shown in FIG. 1B was used. ITO having a thickness of 100 nm was patterned on a glass substrate so that the resultant opposing electrode has an area of 3 mm² similarly as in Example 1. The organic layers and the electrode layers below were continuously vacuum deposited on the ITO substrate by resistive heating in the vacuum chamber at $10^{-4}$ Pa.

Organic layer 1 (40 nm): αNPD
Organic layer 2 (20 nm): 100% of the exemplary compound 1
Organic layer 3 (50 nm): Bphen (shown in FIG. 2)
Metal electrode layer 1 (1 nm): KF
Metal electrode layer 2 (100 nm): Al In this example, the cathodeerror was composed of only the exemplary compound 1 without using a host.

Figure 15A:
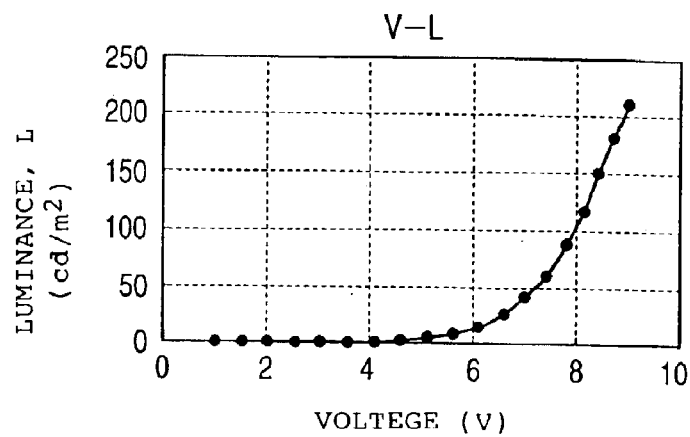
FIG. 15A is a graph showing a voltage-luminance characteristic of a luminescent device in Example 3.
Figure 15B:
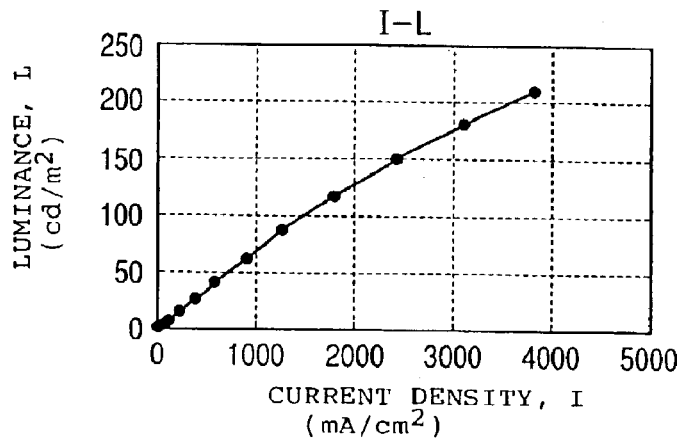
FIG. 15B is a graph showing a current-luminance characteristic of the luminescent device in Example 3.
Figure 15C:
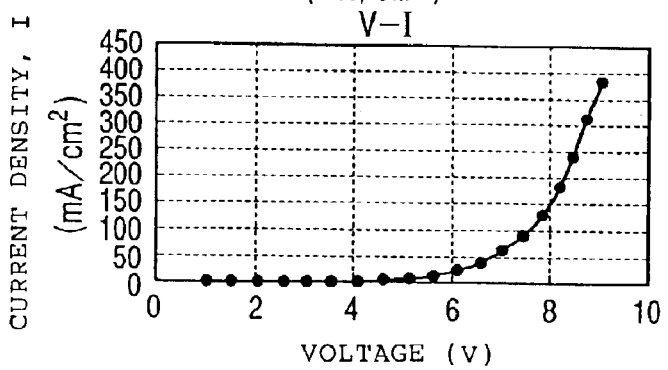
FIG. 15C is a graph showing a voltage-current characteristic of the luminescent device in Example 3.
Figure 15D:
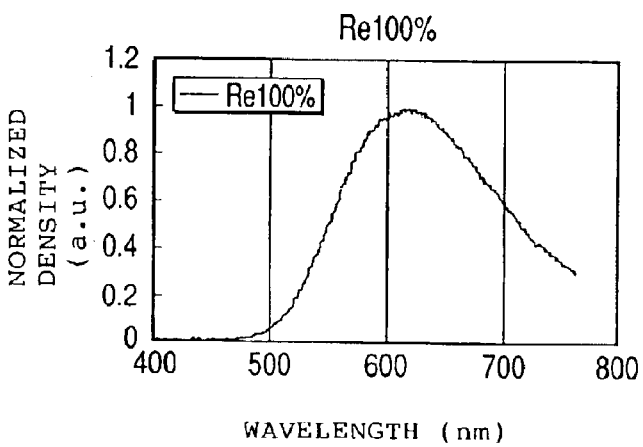
FIG. 15D is a graph showing a luminescence spectrum of the luminescent device in Example 3.

Characteristics of the device were evaluated by applying DC voltage to Al as the negative terminal and ITO as the positive terminal, and the results are shown in FIGS. 15A to 15D. FIG. 15A indicates volt-luminance characteristic; FIG. 15B indicates current-luminance characteristic; and FIG. 15C indicates volt-current characteristic. As obvious from these graphs, good luminescence characteristics was obtained. FIG. 15D shows the luminescence spectrum. Maximum luminescence efficiency was 0.07 cd/A. At this time, a peak of the luminescence spectrum was 663 nm, thereby indicating shifting to longer wavelength as compared with Examples 1 and 2.

As a result, the light-emitting layer without host could be formed, and possibility of the device construction with high productivity could be confirmed.

Example 4

Exemplary compound 131 (compound 1202 shown in FIG. 12) was synthesized according to description of a reference, and a counter-anion of the compound is $CF_3SO_3$ (Inorg. Chem. 32(18), p. 3837, 1993). The compound was dissolved in chloroform with the commercially available polyvinylcarbasole (PVK) at a ratio by weight of 5:95. A film having a thickness of 130 nm was formed using the obtained solution on 100 nm-thick ITO at 1000 rpm (for 20 sec.).

After AlLi (Li 1.8% by weight) was deposited with a thickness of 10 nm thereon, Al was deposited with a thickness of 100 nm to complete preparation of the device. The electric current was applied with the applied voltage of 10 V to Al as the negative electrode and ITO as the positive electrode, resulting in good yellow luminescence.

The stable luminescence was obtained for 100 hours under the electric current supply.

Example 5

Figure 16:
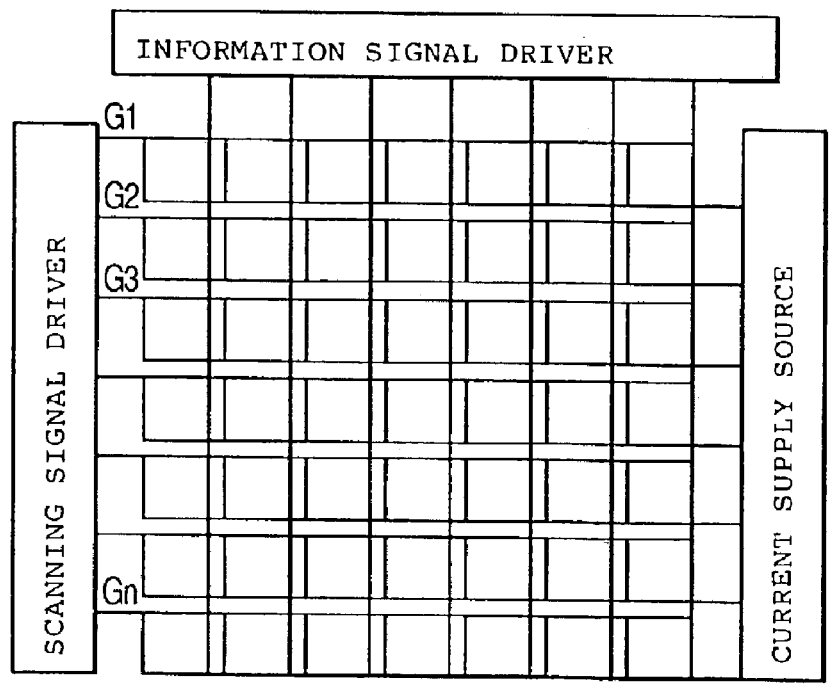
FIG. 16 is a diagram schematically showing a luminescent device which is used in the present invention and has XY matrix wiring, and in which a scanning signal driver is arranged along the X-direction, an information signal driver is arranged along the Y-direction, and a current supply source is arranged.
Figure 17:
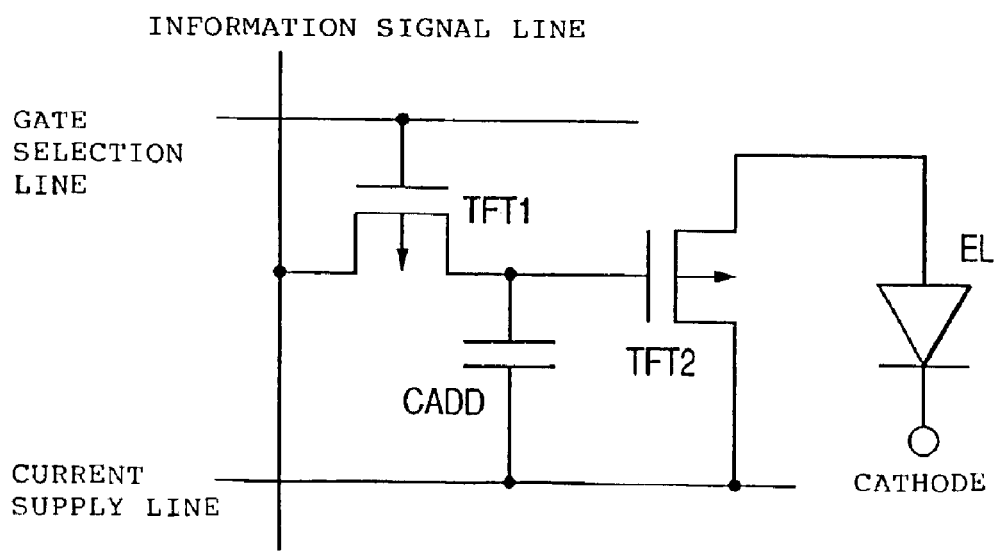
FIG. 17 is an equivalent circuit diagram of the active-matrix type luminescent device used in the present invention.

A color organic EL display was produced using TFT circuit shown in FIG. 16 to FIG. 18. The organic layer and the metal layer were vacuum-deposited and patterned using a hard mask on the area corresponding to each color pixel. Constitution of the organic layer corresponding to each pixel is as follows.

Green pixel: α-NPD (50 nm)/Alq3 (50 nm)
Blue pixel: α-NPD (50 nm)/BCP (20 nm)/Alq3 (50 nm)
Yellow pixel: α-NPD (40 nm)/CBP, exemplary compound 1 (30 nm)/BCP (20 nm)/Alq3 (40 nm)

The exemplary compound 1 in Table 1 was used to coevaporate with the host material CBP at 7% by weight based on CBP, as the metal coordination compound used for light-emitting layer of the yellow pixel.

A pixel arrangement of 128×128 pixels was provided. It was observed that the arrangement allowed desired images to be displayed with stably good image quality. For application to a display, a drive system using a TFT drive circuit, which is an active matrix system, may be used.

FIG. 16 shows a schematic illustration of one example of the configuration of a panel provided with an EL device and drive means. On the panel, a scanning signal driver, an information signal driver and an electric current supply source are arranged, which are connected to gate selection lines, information signal lines and electric current supply lines, respectively. A pixel circuit as shown in FIG. 17 is arranged at an intersecting point of the gate selection line and the information signal line. The scanning signal driver selects the gate selection line G1, G2, G3 . . . Gn sequentially, and an image signal is synchronously applied from the information signal driver.

Next, a pixel circuit will be described. In the pixel circuit, when a selected signal is applied to the gate selection line, TFT1 is turned ON, and the picture signal is supplied to Cadd to determine a gate potential of TFT2. Electric current is supplied to the EL device from the electric current supply lines depending on the gate potential of TFT2. Since the gate potential of TFT2 is maintained in Cadd until TFT1 is selected by subsequent scanning, the electric current is supplied to the EL device until the following scanning is performed. Accordingly, the luminescence can be maintained during the term in one frame.

FIG. 18 is a schematic view showing one example of cross-sectional structure of a TFT substrate used in the present invention. A p-Si layer is formed on a glass plate, and required impurities are doped in the channel regions, the drain regions and the source regions, respectively. A gate electrode is formed on the p-Si layer though a gate insulating layer and a drain electrode and a source electrode are formed to be connected to the drain region and the source region, respectively. An insulating layer and the ITO electrode as the pixel electrode are stacked thereon, and the ITO and the drain electrode are connected through a contact hole.

The present invention is not specifically limited to switching devices, and the present invention can easily be advantageously applied to a single-crystal silicon substrate, an MIM device, a-Si type, etc.

High efficiency electroluminescent device of the present invention can be applied on a product which requires energy saving and high intensity. Examples of application may be a light source for a display unit, lighting system or printer, and a backlight for a liquid crystal display. The electroluminescence device can also provide a display unit such as an energy saving, high visible and light weight flat panel display. In the application of light sources for printers, electroluminescence devices of the present invention will replace the laser light sources currently used of laser beam printers. This makes it possible that the devices individually addressable are arranged in array and irradiate light on a photosensitive drum in a desired manner to form an image. Using the device of the present invention, the size of apparatuses can be reduced drastically. According to the present invention, energy saving effect can be expected on the lighting system and the backlight.

Example 6 (Synthesis of Exemplary Compound No. 21)

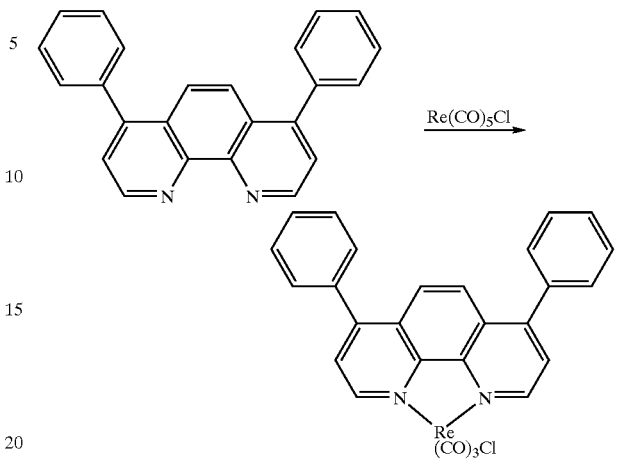

Bathophenanthroline 0.26 g (0.79 mmol) (produced by Dojin Kagaku Kenkyusho), rhenium pentacarbonyl chloride 0.25 g (0.79 mmol) (produced by Aldrich Inc.) and toluene 10 ml were poured into a 30 ml round-bottomed flask, and the mixture was refluxed with stirring for 4 hours. The reaction mixture was cooled to room temperature, concentrated to about half volume using an evaporator, and cooled in a freezer, whereby the precipitated crystal of tricarbonylchloro-4,7-diphenyl-1,10-phenanthroline rhenium (I) was filtered (Yield 0.38 g, percent yield 75%). M+ (corresponding cation mass number with one electron eliminated) of the obtained compound was 638.0 by measurement of MALDI-TOF MS (matrix-assisted laser desorption ionization time-of-flight mass spectrometry).

Example 7 (Synthesis of Exemplary Compound No. 22)

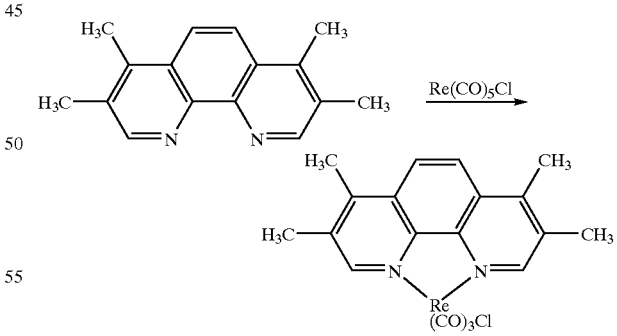

Tricarbonylchloro-3,4,7,8-tetramethyl-1,10-phenanthroline rhenium (I) was obtained from 3,4,7,8-tetramethyl-1,10-phenanthroline and rhenium pentacarbonyl chloride by the same manners as in Example 6. M+ of the obtained compound was 542.0 by measurement of MALDI-TOF MS.

Example 8 (Synthesis of Exemplary Compound No. 28)

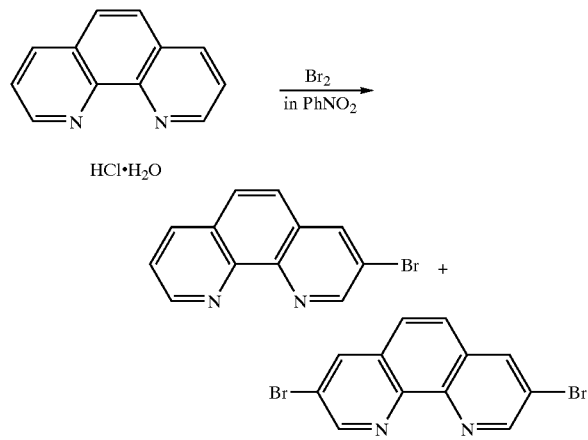

1,10-phenanthroline hydrochloride hydrate was brominated according to the method described in Tetrahedron Lett., 1995, 3489–3490 and the resultant product was purified with hydrochloride according to the method described in Synlett., 2001, No. 10, 1629–1631 to obtain 3-bromo-1,10-phenanthroline and 3,8-dibromo-1,10-phenanthroline.

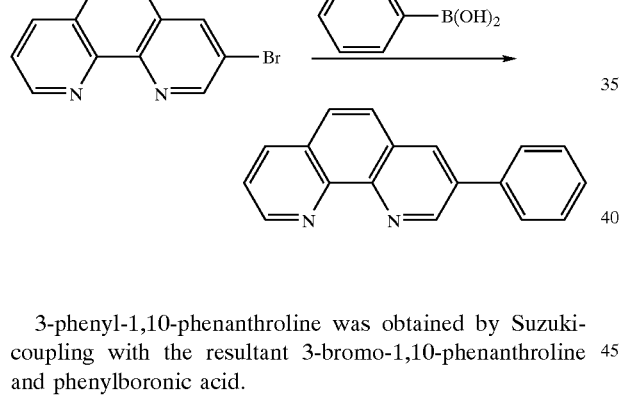

3-phenyl-1,10-phenanthroline was obtained by Suzuki-coupling with the resultant 3-bromo-1,10-phenanthroline and phenylboronic acid.

Tricarbonylchloro-3-phenyl-1,10-phenanthroline rhenium (I) was obtained from 3-phenyl-phenanthroline and rhenium pentacarbonyl chloride by the same manners as in Example 6. M+ of the obtained compounds was 562.0 by measurement of MALDI-TOF MS.

Example 9 (Synthesis of Exemplary Compound No. 27)

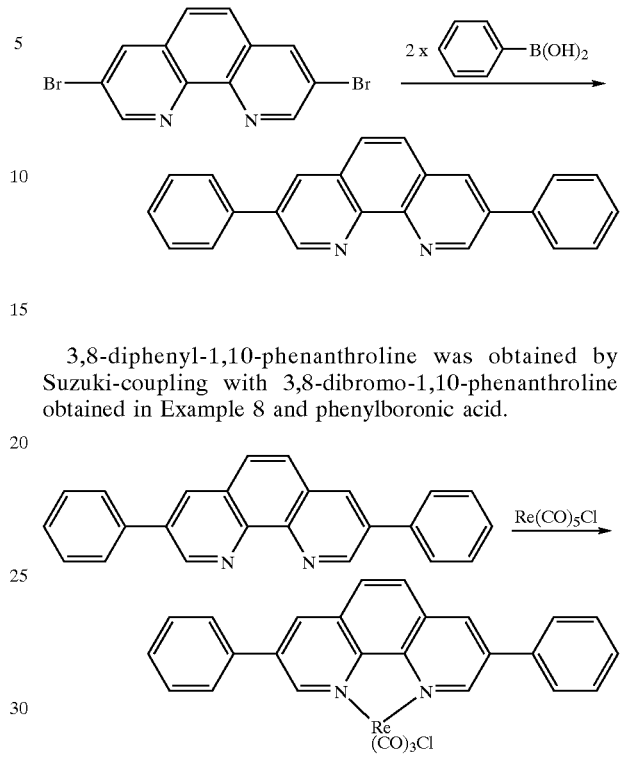

3,8-diphenyl-1,10-phenanthroline was obtained by Suzuki-coupling with 3,8-dibromo-1,10-phenanthroline obtained in Example 8 and phenylboronic acid.

Tricarbonylchloro-3,8-diphenyl-1,10-phenanthroline rhenium (I) was obtained by the same manners as in Example 6. M+ of the obtained compound was 638.0 by measurement of MALDI-TOF MS.

Example 10 (Synthesis of Exemplary Compound No. 32)

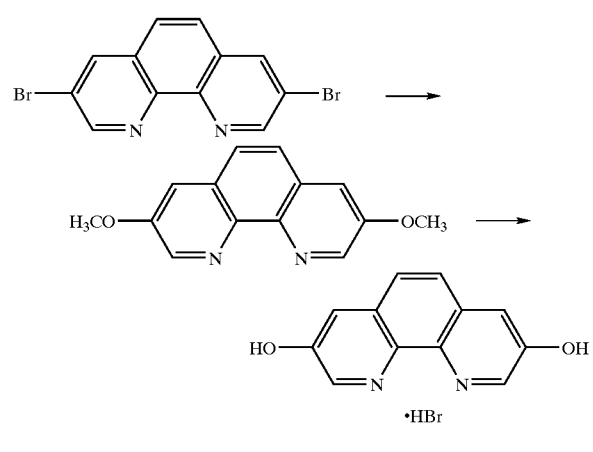

3,8-dihydroxy-1,10-phenanthroline hydrobromate was synthesized using 3,8-dibromo-1,10-phenanthroline obtained in Example 8 through 3,8-dimethoxy-1,10-phenanthroline according to the method described in Synlett., 2001, No. 10, 1629–1631.

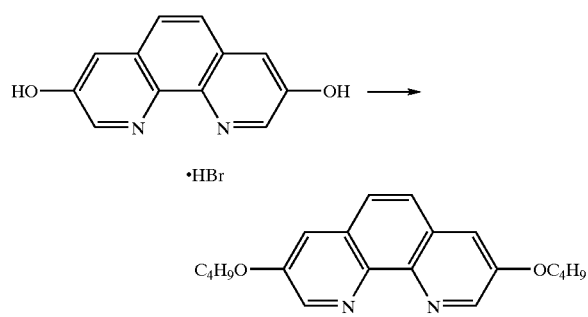

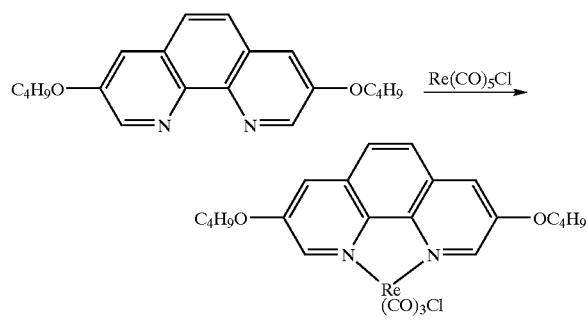

3,8-dibutoxy-1,10-phenanthroline was synthesized from 3,8-dihydroxy-1,10-phenanthroline hydrobromate and 1-bromobutane using sodium hydride.

Tricarbonylchloro-3,8-dibutoxy-1,10-phenanthroline rhenium (I) was obtained by the same manners as in Example 6. M+ of the obtained compound was 630.1 by measurement of MALDI-TOF MS.

Example 11 (Synthesis of Exemplary Compound No. 30)

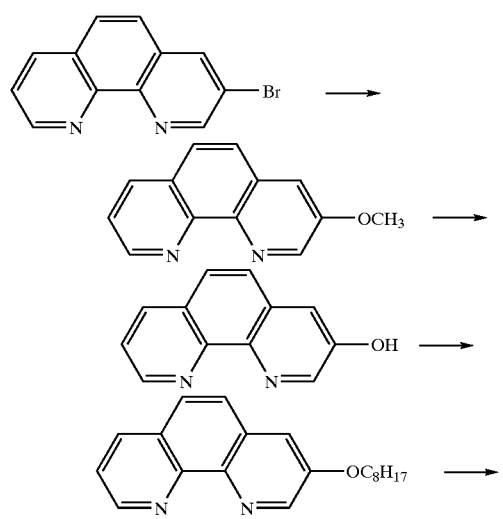

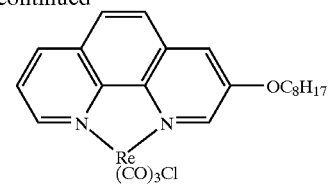

3-hydroxy-1,10-phenanthroline hydrobromate was synthesized using 3-bromo-1,10-phenanthroline obtained in Example 6 through 3-methoxy-1,10-phenanthroline according to the same manners as in Example 10. 3-octyloxy-1,10-phenanthroline was synthesized from 3-hydroxy-1,10-phenanthroline hydrobromate and 1-bromooctane using sodium hydride. Tricarbonylchloro-3-octyloxy-1,10-phenanthroline rhenium (I) was obtained by the same manners as in Example 6. M+ of the obtained compound was 614.1 by measurement of MALDI-TOF MS.

Example 12 (Synthesis of Exemplary Compound No. 33)

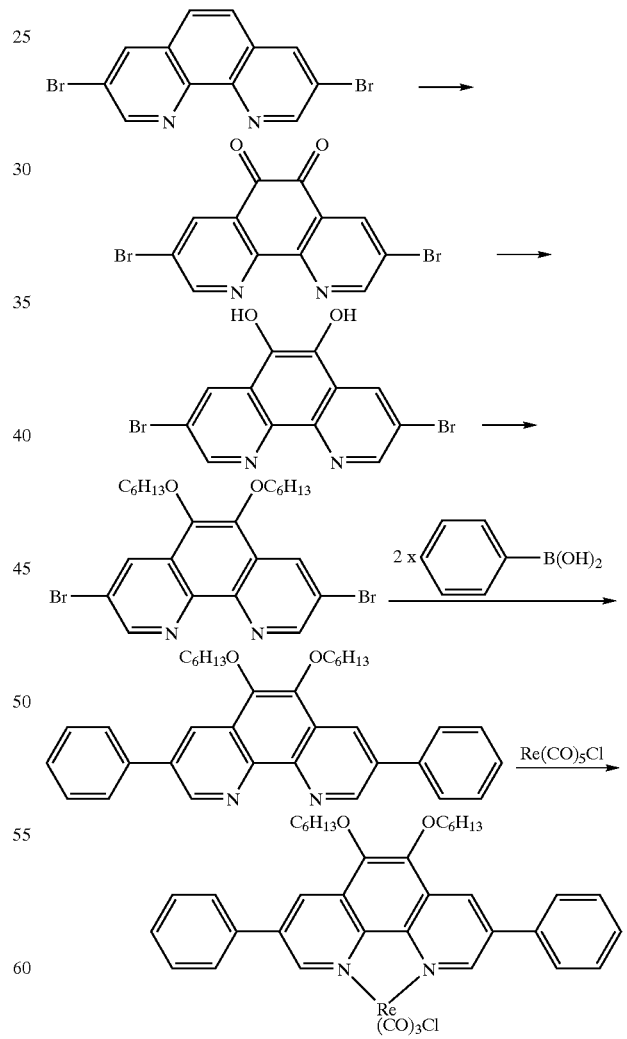

3,8-dibromo-5,6-dihydroxy-1,10-phenanthroline was synthesized using 3,8-dibromo-1,10-phenanthroline obtained in Example 6 through 3,8-dibromo-5,6-dioxo-1,10- phenanthroline according to the method described in Chem. Lett., 2002, 774–775. 3,8-dibromo-5,6-dihexyloxy-1,10-phenanthroline was synthesized from 3,8-dibromo-5,6-dihydroxy-1,10-phenanthroline and 1-iodohexane using sodium hydride. 3,8-diphenyl-5,6-dihexyloxy-1,10-phenanthroline was obtained by Suzuki-coupling of 3,8-dibromo-5,6-dihexyloxy-1,10-phenanthroline and phenylboronic acid.

Tricarbonylchloro-3,8-diphenyl-5,6-dihexyloxy-1,10-phenanthroline rhenium (I) was obtained by the same manners as in Example 6. M+ of the obtained compound was 838.2 by measurement of MALDI-TOF MS.

Example 13 (Synthesis of Exemplary Compound No. 23)

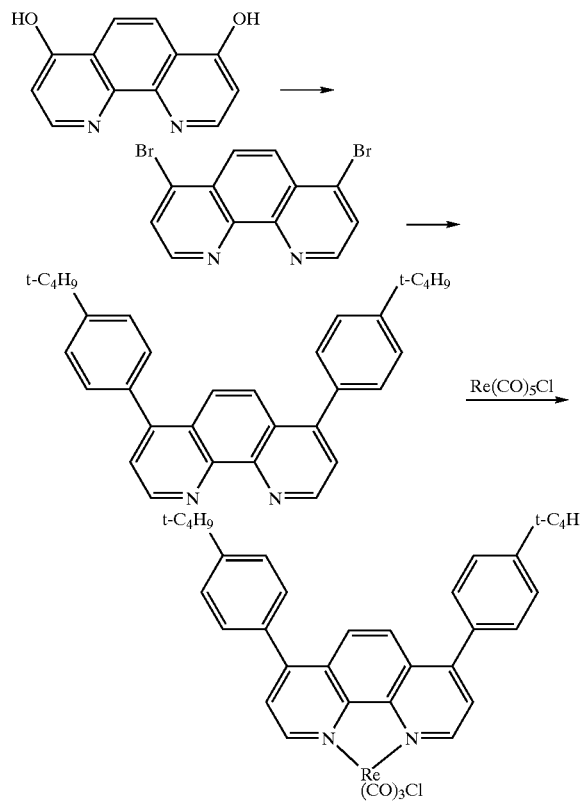

4,7-dibromo-1,10-phenanthroline was synthesized using 4,7-dihydroxy-1,10-phenanthroline (produced by Aldrich Inc.) by using the method described in J. Org. Chem., 1951, 16, 941–945. 4,7-di(4-t-butylphenyl)-1,10-phenanthroline was obtained by Suzuki-coupling of the 4,7-dibromo-1,10-phenanthroline with 4-t-butylphenylboronic acid produced by Lancaster Inc.

Tricarbonylchloro-4,7-di(4-t-butylphenyl)-1,10-phenanthroline rhenium (I) was obtained by the same manners as in Example 6. M+ of the obtained compound was 750.2 by measurement of MALDI-TOF MS.

Example 14 (Synthesis of Exemplary Compound No. 24)

Tricarbonylchloro-4,7-di{3,5-bis(trifluoromethyl)phenyl}-1,10-phenanthroline rhenium (I) was obtained by the same manners as in Example 13 except for, in place of 4-t-butylphenylboronic acid used in Example 13, using 3,5-bis(trifluoromethyl)phenylboronic acid produced by Aldrich Inc. M+ of the obtained compound was 910.0 by measurement of MALDI-TOF MS.

Example 15 (Synthesis of Exemplary Compound No. 26)

Tricarbonylchloro-4,7-di(2-naphthyl)-1,10-phenanthroline rhenium (I) was obtained by the same manners as in Example 13 except for, in place of 4-t-butylphenylboronic acid used in Example 13, using 2-naphthaleneboronic acid produced by Aldrich Inc. M+ of the obtained compound was 738.1 by measurement of MALDI-TOF M).

Example 16 (Synthesis of Exemplary Compound No. 25)

Tricarbonylchloro-4,7-di(pentafluorophenyl)-1,10-phenanthroline rhenium (I) was obtained by the same manners as in Example 13 except for, in place of 4-t-butylphenylboronic acid used in Example 13, using pentafluorophenylboronic acid produced by Aldrich Inc. M+ of the obtained compound was 818.0 by measurement of MALDI-TOF MS.

Example 17 (Synthesis of Exemplary Compound No. 35)

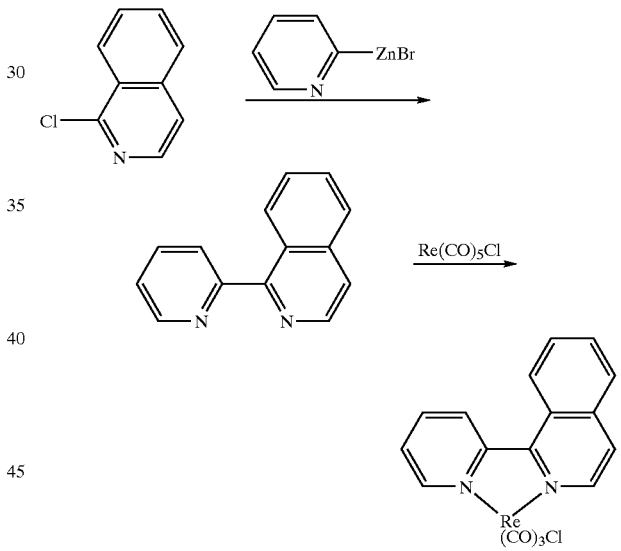

1-(2-pyridyl)isoquinoline was synthesized using 2-pyridyl zinc bromide and 1-chloroisoquinoline produced by Aldrich Inc. by using the method described in J. Org. Chem., 1991, 56, 1445–1453. Tricarbonylchloro-1-(2-pyridyl)isoquinoline rhenium (I) was obtained by the same manners as in Example 6. M+ of the obtained compound was 512.0 by measurement of MALDI-TOF MS.

Example 18 (Synthesis of Exemplary Compound No. 37)

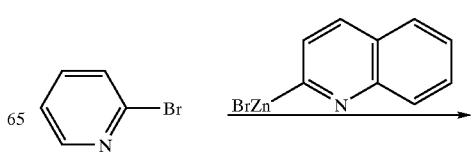

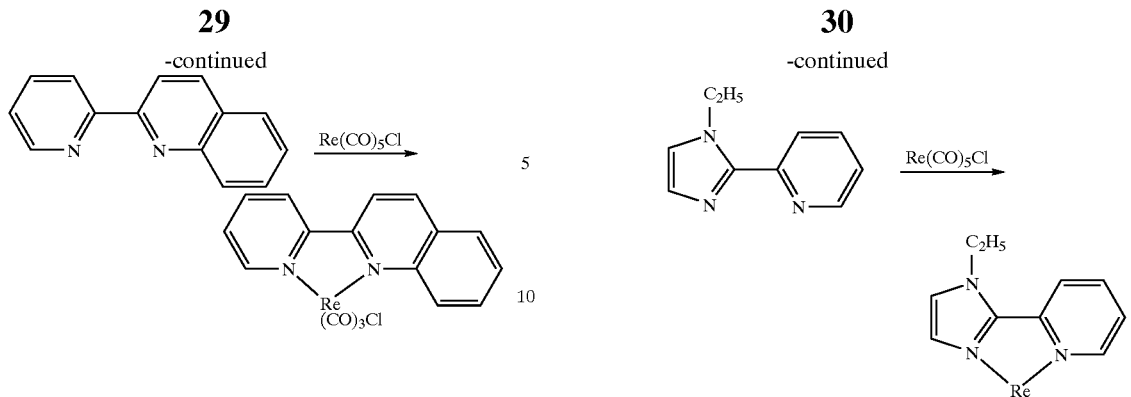

2-(2-pyridyl)quinoline was synthesized using 2-quinolyl zinc bromide and 2-bromopyridine. Tricarbonylchloro-2-(2-pyridyl)quinoline rhenium (I) was obtained by the same manners in Example 6. M+ of the obtained compound was 512.0 by measurement of MALDI-TOF MS.

Example 19 (Synthesis of Exemplary Compound No. 3)

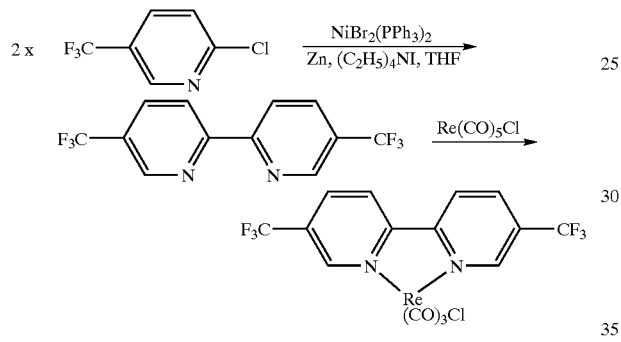

5,5'-ditrifluoromethyl-2,2'-bipyridine was synthesized by homocoupling of 2-chloro-5-trifluoromethylpyridine produced by Tokyo Kasei Kogyo Co., Ltd. according to the method described in Bull. Chem. Soc. Jpn., 63, 1990, 80–87. Tricarbonylchloro-5,5'-ditrifluoromethyl-2,2'-bipyridine rhenium (I) was obtained by the same manners as in Example 6. M+ of the obtained compound was 598.0 by measurement of MALDI-TOF MS.

Example 20 (Synthesis of Exemplary Compound No. 9)

Tricarbonylchloro-4,4'-ditrifluoromethyl-2,2'-bipyridine rhenium (I) was obtained by the same method described in Example 19 except for, in place of 2-chloro-5-trifluoromethylpyridine used in Example 19, using 2-chloro-4-trifluoromethylpyridine produced by Oakwood Inc. M+ of the obtained compound was 598.0 by measurement of MALDI-TOF MS.

Example 21 (Synthesis of Exemplary Compound No. 45)

1-ethyl-2-(2-pyridyl)imidazole was synthesized from N-ethylimidazole and 2-bromopyridine produced by Tokyo Kasei Kogyo Co., Ltd. according to the method described in Tetrahedron Lett., 29, 1988, 5013–5016. Tricarbonylchloro-1-ethyl-2-(2-pyridyl) imidazole rhenium (I) was obtained by the same manners as in Example 6. M+ of the obtained compounds was 479.0 by measurement of MALDI-TOF MS.

Example 22 (Synthesis of Exemplary Compound No. 34)

$C_6H_{13}CH_2COOC_2H_5 \longrightarrow$

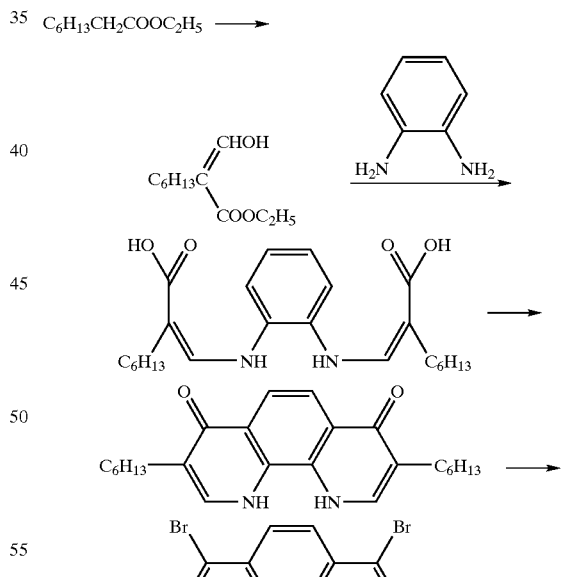

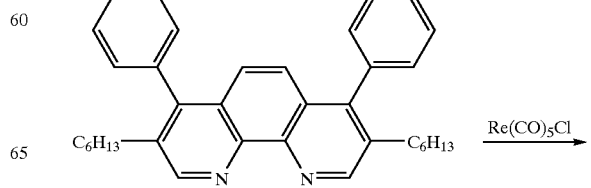

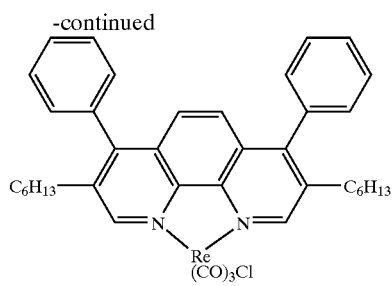

2-formyl ethyl octanoate was synthesized from ethyl octanoate produced by Aldrich Inc. by using the method described in Arch. Pharm., 317, 1984, 425–430, and then 3,8-dihexyl-4,7-diphenyl-1,10-phenanthroline was synthesized by using the method described in Synlett., 1997, No. 9, 1096–1098. Tricarbonylchloro-3,8-dihexyl-4,7-diphenyl-1,10-phenanthroline rhenium (I) was obtained by the same manners as in Example 6. M+ of the obtained compound was 806.2 by measurement of MALDI-TOF MS.

Example 23 (Synthesis of Exemplary Compounds No. 302 and No. 134)

Ionic rhenium complexes hereinbelow were synthesized by using tricarbonylchloro-3,4,7,8-tetramethyl-1,10-phenanthroline rhenium (I) obtained in Example 7 according to the method described in J. Phys. Chem., 1983, 87, 952–957.

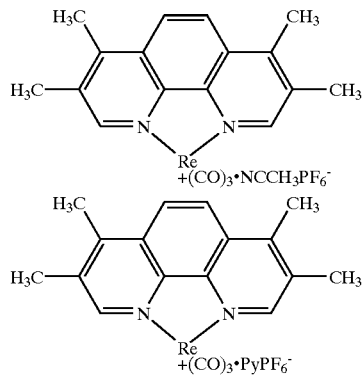

wherein Py represents pyridine. M+ of the obtained compounds were 693.1 and 731.1, respectively, by measurement of MALDI-TOF MS.

Example 24 (Synthesis of Exemplary Compound No. 46)

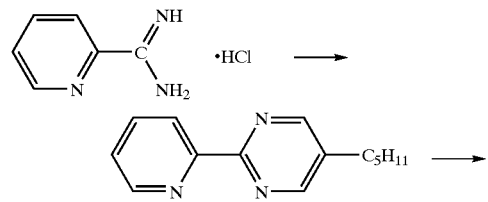

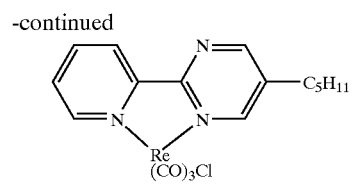

5-pentyl-2-(2-pyridyl)pyrimidine was synthesized from 2-amidinopyridinium hydrochloride hydrate and α-pentyl-β-dimethylaminoacrolein produced by Lancaster Inc. by using the method described in J. prakt. Chem., 1975, 317, 617–630. Tricarbonylchloro-5-pentyl-2-(2-pyridyl)pyrimidine rhenium (I) was obtained by the similar process described in Example 6. M+ of the obtained compound was 533.1 by measurement of MALDI-TOF MS.

Example 25 (Synthesis of Exemplary Compounds No. 41 and No. 350)

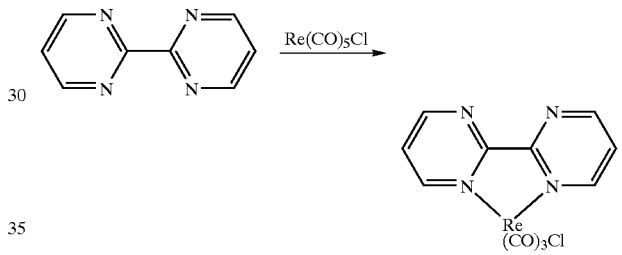

Tricarbonylchloro-2,2'-bipyrimidine rhenium (I) was obtained by reacting 2,2'-bipyrimidine produced by Lancaster Inc. with one equivalent of rhenium pentacarbonyl chloride produced by Aldrich Inc. using the same manners as in Example 6. M+ of the obtained compound was 464.0 by measurement of MALDI-TOF MS.

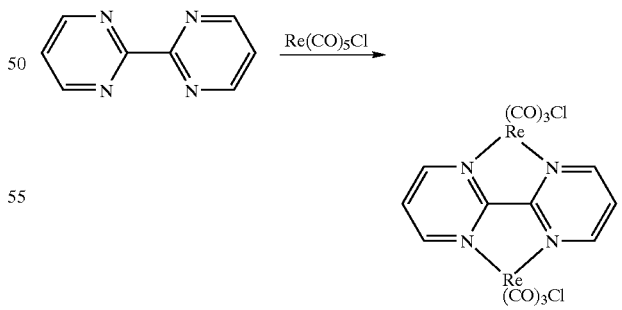

μ-2,2'-bipyrimidine-bis[tricarbonylchloro-rhenium(I)] was obtained from 2,2'-bipyrimidine and 2 equivalents of rhenium pentacarbonylchloride. M+ of the obtained compound was 769.9 by measurement of MALDI-TOF MS.

Example 26 (Synthesis of Exemplary Compound No. 104)

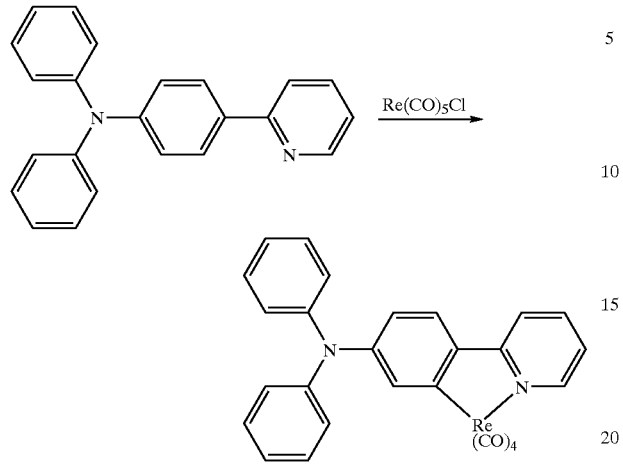

2-(4-diphenylaminophenyl)pyridine 0.39 g (1.2 mmole), rhenium pentacarbonylchloride produced by Aldrich Inc. 0.40 g (1.1 mmole) and toluene 10 ml were poured into a 50 ml three-necked flask under nitrogen atmosphere and refluxed under stirring for 3 hours. After terminating the reaction, a reactant was dried in vacuum to remove a solvent, and the residue was purified by using silica gel column chromatography (eluting solution: mixed solvent of hexane and toluene) to obtain yellow crystals of tetracarbonyl-[2-(4-diphenylaminophenyl) pyridine-$C^2$,N] rhenium (I) (Yield 0.26 g, percent yield: 38%). M+ of the obtained compound was 620.1 by measurement of MALDI-TOF MS.

Example 27 (Synthesis of Exemplary Compound No. 103)

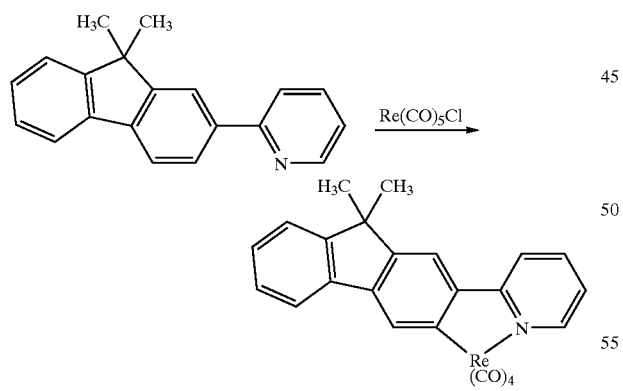

Tetracarbonyl-[2-(9,9-dimethylfluorenyl)-$C^2$,N] rhenium (I), yellow crystal, was obtained by the same manners as in Example 26 except for, in place of 2-(4-diphenylaminophenyl)pyridine used in Example 26, using 2-(9,9-dimethylfluorenyl)pyridine (Percent yield 32%). M+ of the obtained compound was 569.1 by measurement of MALDI-TOF MS.

Example 28 (Synthesis of Exemplary Compound No. 355)

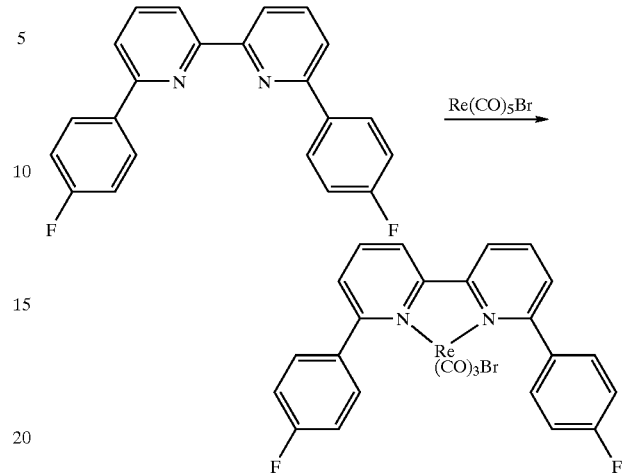

6,6'-di(4-fluorophenyl)-2,2'-bipyridine 0.47 g (1.4 mmole), rhenium pentacarbonylbromide produced by Strem Inc. 0.50 g (1.2 mmole) and toluene 5 ml were poured into a 50 ml three-necked flask under nitrogen atmosphere and refluxed under stirring for 3 hours. After termination of the reaction, the reaction mixture was cooled to room temperature and collected yellow crystals of the precipitated tricarbonylbromo-6,6'-di(4-fluorophenyl)-2,2'-bipyridine rhenium (I) by filtration (Yield 0.43 g, percent yield 50%). M+ of the obtained compound was 694.0 by measurement of MALDI-TOF MS.

Example 29 (Synthesis of Exemplary Compound No. 356)

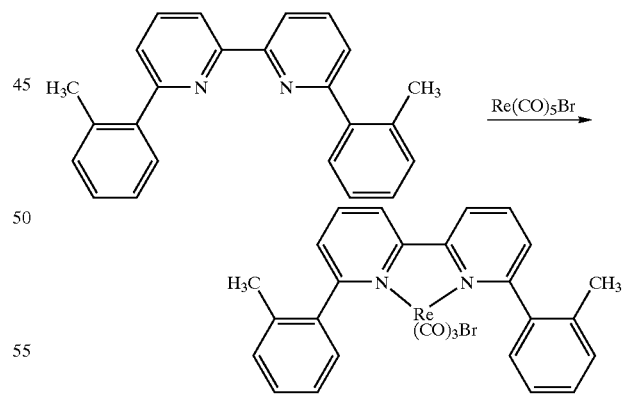

Tricarbonylbromo-6,6'-di(2-methylphenyl)-2,2'-bipyridine rhenium (I), yellow crystal, was obtained by the same manners as in Example 28 except for, in place of 6,6'-di(4-fluorophenyl)-2,2'-bipyridine, using 6,6'-di(2-methylphenyl)-2,2'-bipyridine (Yield 0.51 g, percent yield 60%). M+ of the obtained compound was 686.0 by measurement of MALDI-TOF MS.

Example 30 (Synthesis of exemplary compound No. 353)

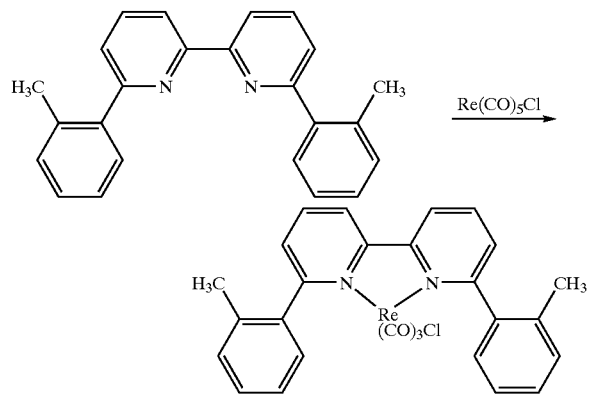

Tricarbonylchloro-6,6'-di(2-methylphenyl)-2,2'-bipyridine rhenium (I), yellow crystal, was obtained by the same manners as in Example 29 except for, in place of rhenium pentacarbonylbromide used in Example 29, using rhenium pentacarbonylchloride produced by Aldrich Inc. (Yield 0.45 g, percent yield 63%). M+ of the obtained compound was 642.1 by measurement of MALDI-TOF MS.

Example 31 (Synthesis of Exemplary Compound No. 521)

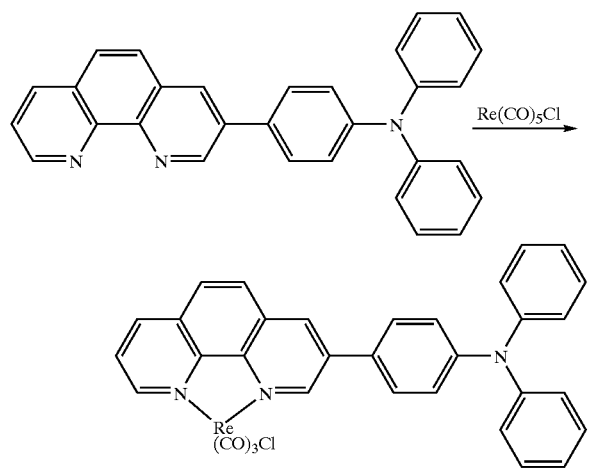

Tricarbonylchloro-3-(4-diphenylaminophenyl)-1,10-phenanthroline rhenium (I), yellow crystal, was obtained by the same manners as in Example 30 except for, in place of 6,6'-di(2-methylphenyl)-2,2'-bipyridine used in Example 30, using 3-(4-diphenylaminophenyl)-1,10-phenanthroline (Yield 0.41 g, percent yield 51%). M+ of the obtained compound was 729.1 by measurement of MALDI-TOF MS.

Example 32

An EL device similar to that of Example 2 was produced except that the exemplary compound 1 in the organic layer 2 was replaced by the exemplary compound 17 and the doping concentration was set in 1.6% by weight.

Figure 19A:
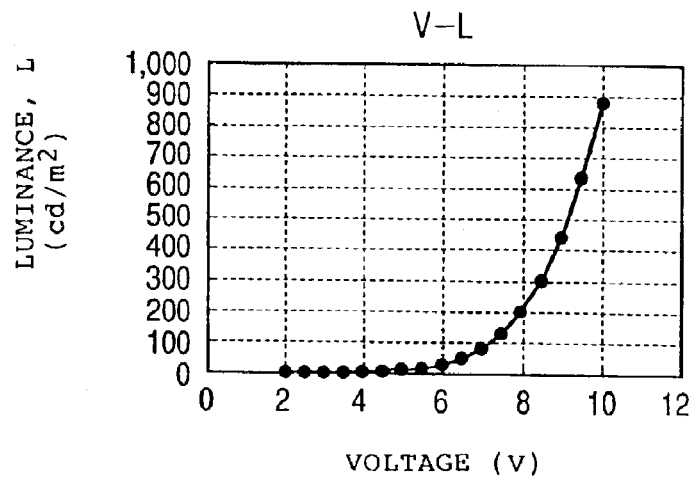
FIG. 19A is a graph showing a voltage-luminance characteristic of the device of the present invention measured by applying a DC voltage to the device.
Figure 19B:
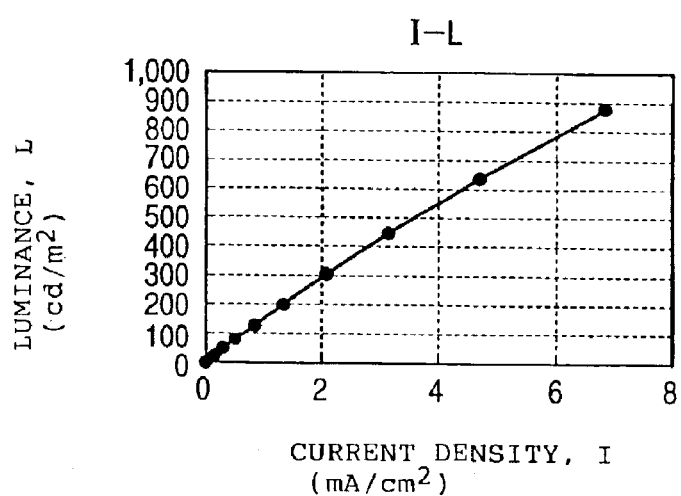
FIG. 19B is a graph showing a current-luminance characteristic of the device of the present invention measured by applying a DC voltage to the device.
Figure 19C:
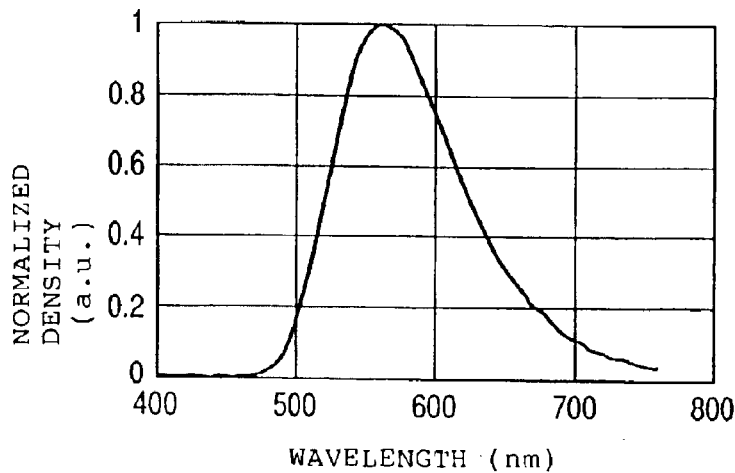
FIG. 19C is a graph showing a luminescence spectrum of the device of the present invention measured by applying a DC voltage to the device.

Characteristics of the device were evaluated by applying DC voltage to Al as the negative terminal and ITO as the positive terminal, and the results are shown in FIGS. 19A, 19B and 19C. FIGS. 19A, 19B and 19C show the voltage-luminance, the current-luminance and the luminescence spectrum, respectively. As obvious from these graphs, good luminescent characteristics was obtained. The luminescence efficiency was 17 cd/A, 8.6 lm/W at 300 cd/m$^2$. At this time, the peak of the luminescence spectrum was 565 nm. The external luminescence effect of luminescence of the device was 7% by calculating from these data, which largely exceeded the theoretical limit of 5% of the organic electroluminescent device, and the high luminescence efficiency specific to the phosphorescent device from triplet state was obtained. Re metal coordination compound of the present invention was confirmed to be useful for the phosphorescent device.

Example 33

An EL device similar to that of Example 3 was produced except that the exemplary compound 1 in the organic layer 2 was replaced by the exemplary compound 17.

In this example, the light-emiting layer was formed using only the exemplary compound 17 without using the host.

Figure 20A:
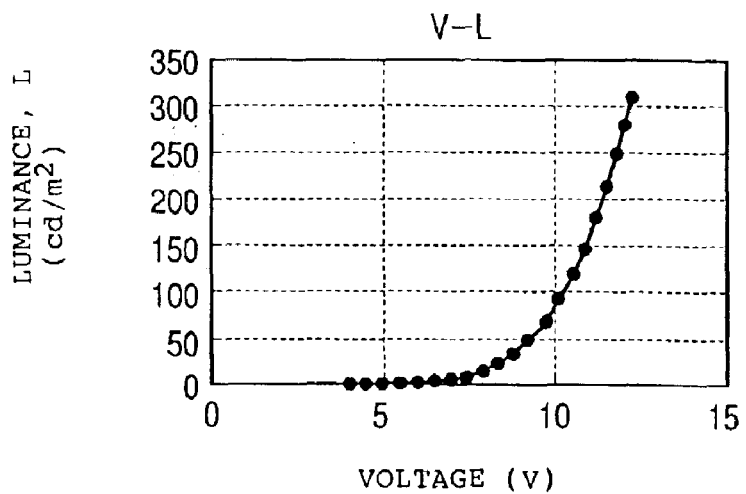
FIG. 20A is a graph showing a voltage-luminance characteristic of the another device of the present invention measured by applying a DC voltage to the another device.
Figure 20B:
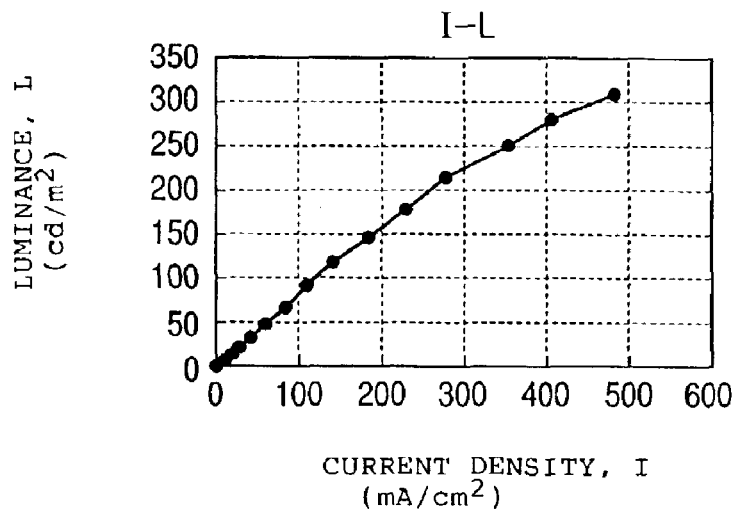
FIG. 20B is a graph showing a current-luminance characteristic of the another device of the present invention measured by applying a DC voltage to the another device.
Figure 20C:
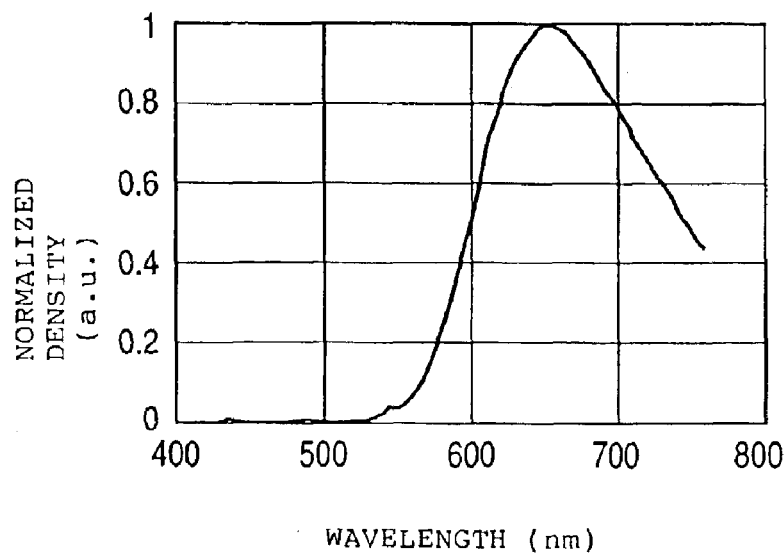
FIG. 20C is a diagram showing a luminescence spectrum of the another device of the present invention measured by applying a DC voltage to the another device.

Characteristics of the device were evaluated by applying DC voltage to Al as the negative terminal and ITO as the positive terminal, and the results are shown in FIGS. 20A, 20B and 20C. FIGS. 20A, 20B and 20C show the voltage-luminance characteristic, the current-luminance characteristic and the luminescence spectrum of the device, respectively. As obvious from these graphs, stable and good luminance characteristics was obtained. Maximum luminescence efficiency was 0.07 cd/A. A peak of the luminescence spectrum in this time was 663 nm, indicating shifting to longer wavelength as compared with Example 32. Maximum EL efficiency was 0.2 lm/W, 0.5 cd/A. A peak of the luminescence spectrum was 650 nm and clear red luminescence was obtained. Further, stable luminescence was obtained after energization for 100 hours.

As a result, the light-emitting layer without the host was formed, and it was found that the device formation with high productivity was available.

Example 34

An EL device similar to that of Example 2 was produced except that the exemplary compound 1 in the organic layer 2 was replaced by the exemplary compound 21 synthesized in Example 6 and the doping concentration was set in 5.0% by weight.

The device characteristics were evaluated by applying DC voltage to Al as the negative terminal and ITO as the positive terminal. Preferable and stable luminescence characteristics was obtained. The luminescence efficiency was 11 cd/A, 5.2 lm/W at 300 cd/m$^2$. The peak of the luminescence spectrum was 550 nm at this time.

Example 35

An EL device similar to that of Example 2 was produced except that the exemplary compound 1 in the organic layer 2 was replaced by the exemplary compound 21 synthesized in Example 6.

In this example, the cathodeerror was formed using only the exemplary compound 21 without using the host.

As a result of evaluating the device characteristics by applying DC voltage to A as the negative terminal and ITO as the positive terminal, preferable luminescent characteristics was obtained. The peak of the luminescence spectrum was 605 nm at this time. Maximum EL efficiency was 1.1 lm/W, 3.0 cd/A. Further, stable luminescence was obtained after energization for 100 hours.

Example 36

An EL device similar to that of Example 3 was propduced except that the exemplary compound 1 in the organic layer 2 was replaced by the exemplary compound 23 synthesized in Example 13.

In this example, the light-emitting layer was formed using only the exemplary compound 23 without using the host.

As a result of evaluating the device characteristics by applying DC voltage to Al as the negative terminal and ITO as the positive terminal, preferable luminescence characteristics was obtained. The peak of the luminescence spectrum was 580 nm at this time. Maximum EL efficiency was 1.6 lm/W, 3.1 cd/A. Further, stable luminescence was obtained after energization 100 hours.

Example 37

An EL device similar to that of Example 3 was produced except that the exemplary compound 1 in the organic layer 2 was replaced by the exemplary compound 3 synthesized in Example 19.

In this example, the light-emitting layer was formed using only the exemplary compound 3 without using the host.

As a result of evaluating the device characteristics by applying DC voltage to the negative terminal Al and the positive terminal ITO, preferable luminescent characteristics was obtained. The peak of the luminescence spectrum was 566 nm at this time. Maximum EL efficiency was 1.5 lm/W, 2.8 cd/A. Further, stable luminescence was obtained after energization for 100 hours.

Example 38

An EL device similar to that of Example 3 was produced except that the exemplary compound 1 in the organic layer 2 was replaced by the exemplary compound 104 synthesized in Example 26.

In this example, the light-emitting layer was formed using only the exemplary compound 104 without using the host.

As a result of evaluating the device characteristics by applying DC voltage to Al as the negative terminal and ITO as the positive terminal, preferable luminescence characteristics was obtained. The peak of the luminescence spectrum was 570 nm at this time. Maximum EL efficiency was 0.3 lm/W, 0.7 cd/A. Further, stable luminescence was obtained after energization 100 hours.

Example 39

An EL device similar to that of Example 3 was produced except that the exemplary compound 1 in the organic layer 2 was replaced by the exemplary compound 356 synthesized in Example 29.

In this example, the light-emitting layer was formed using only the exemplary compound 356 without using the host.

As a result of evaluating the device characteristics by applying DC voltage to Al as the negative terminal and ITO as the positive terminal, preferable luminescence characteristics was obtained. The peak of the luminescence spectrum was 595 nm at this time. Maximum EL efficiency was 0.2 lm/W, 0.8 cd/A. Further, stable luminescence was obtained after energization for 100 hours.

It was shown that the rhenium coordination compound of the present invention can be applied to an organic EL device to provide an EL devices with high luminescence efficiency and excellent chemical stability during production. High efficient EL devices according to the present invention can be applied to products which requires energy saving and high luminescence intensity.

For example, it can be applicable to backlights for liquid crystal devices and illuminations for home use.

What is claimed is:

1. An electroluminescent device comprising:

a pair of electrodes; and at least one organic compound layer provided between the pair of electrodes, wherein the organic compound layer comprises a light-emitting layer composed of a compound selected from the group consisting of:

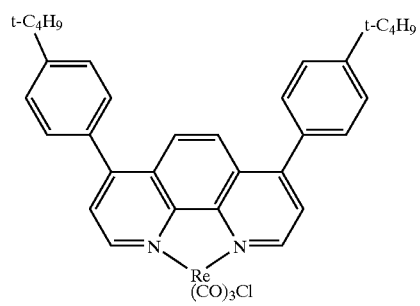

(Compound No. 23)

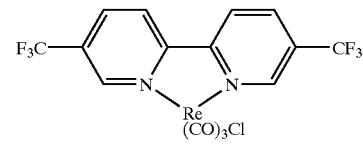

(Compound No. 3)

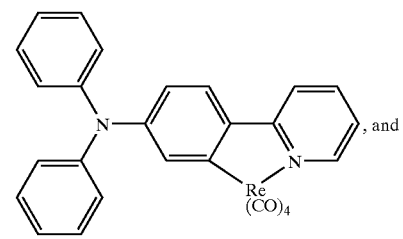

(Compound No. 104), and

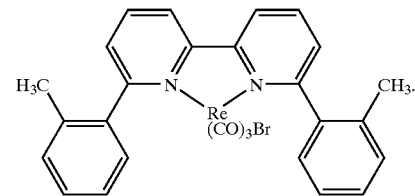

(Compound No. 356)

2. A display apparatus comprising an electroluminescent device according to claim 1, and a thin film transistor (TFT).

3. An organic compound represented by the following structural formula:

4. An organic compound represented by the following structural formula:
(Compound No. 23)
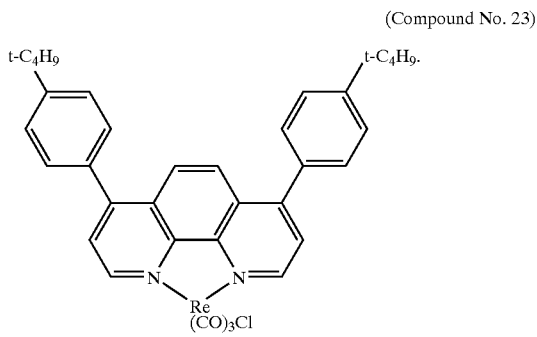
5. An organic compound represented by the following structural formula:
(Compound No. 3)
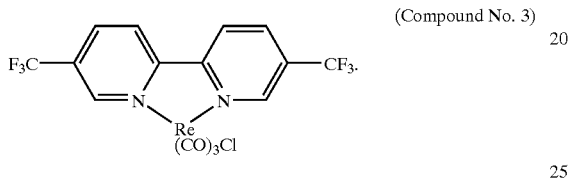
6. An organic compound represented by the following structural formula:
(Compound No. 104)
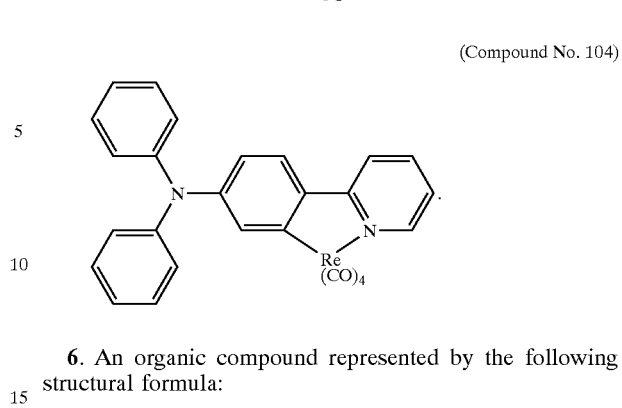
(Compound No. 356)
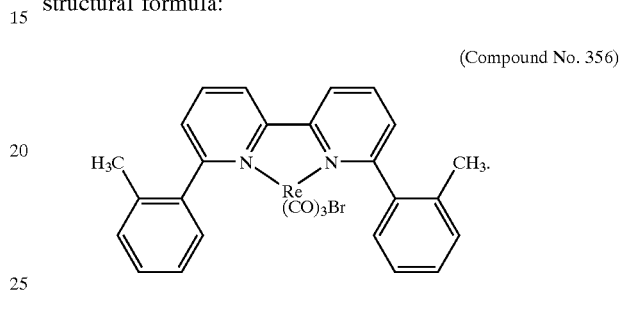
* * * * *